United States Patent
Song et al.

(10) Patent No.: US 10,955,369 B2
(45) Date of Patent: Mar. 23, 2021

(54) MASK INSPECTION APPARATUSES AND METHODS, AND METHODS OF FABRICATING MASKS INCLUDING MASK INSPECTION METHODS

(71) Applicant: Samsung Electronics Co., Ltd., Suwon-si (KR)

(72) Inventors: Hyon-Seok Song, Suwon-si (KR); In-Yong Kang, Seoul (KR); Il-Yong Jang, Yongin-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/437,468

(22) Filed: Jun. 11, 2019

(65) Prior Publication Data

US 2020/0150062 A1     May 14, 2020

(30) Foreign Application Priority Data

Nov. 12, 2018  (KR) ...................... 10-2018-0138297
Jan. 18, 2019  (KR) ...................... 10-2019-0006928

(51) Int. Cl.
| | |
|---|---|
| *G01N 23/2251* | (2018.01) |
| *G01B 15/00* | (2006.01) |
| *G03F 7/20* | (2006.01) |

(52) U.S. Cl.
CPC ......... *G01N 23/2251* (2013.01); *G01B 15/00* (2013.01); *G03F 7/7065* (2013.01); *G01N 2223/07* (2013.01); *G01N 2223/611* (2013.01); *G01N 2223/646* (2013.01)

(58) Field of Classification Search
CPC ...... G01N 23/2251; H01J 37/00; H01J 37/02; H01J 37/26; H01J 37/28
USPC .............. 250/306, 307, 310, 311, 492.3
See application file for complete search history.

(56) References Cited

U.S. PATENT DOCUMENTS

| | | | | |
|---|---|---|---|---|
| 5,892,224 | A * | 4/1999 | Nakasuji | G01N 23/225 250/307 |
| 7,442,947 | B2 | 10/2008 | Yamada | |
| 7,599,054 | B2 | 10/2009 | Takeda | |
| 8,822,919 | B2 | 9/2014 | Kimba | |
| 9,136,091 | B2 | 9/2015 | Kimba | |
| 9,478,395 | B1 | 10/2016 | Monahan | |
| 9,620,332 | B1 | 4/2017 | Lam | |
| 10,020,166 | B1 | 7/2018 | Monahan | |
| 2004/0113073 | A1* | 6/2004 | Nakasuji | H01J 37/067 250/306 |
| 2010/0282956 | A1* | 11/2010 | Kimba | H01J 37/28 250/252.1 |

(Continued)

*Primary Examiner* — Jason L McCormack
(74) *Attorney, Agent, or Firm* — Myers Bigel, P.A.

(57) ABSTRACT

Mask inspection apparatuses and/or mask inspection methods are provided that enable quick and accurate inspection of a registration of a pattern on a mask while a defect of the mask and the registration of the pattern are inspected simultaneously. The mask inspection apparatus may include a stage configured to receive a mask for inspection; an e-beam array including a plurality of e-beam irradiators configured to irradiate e-beams to the mask and detectors configured to detect electrons emitted from the mask; and a processor configured to process signals from the detectors. A defect of the mask may be detected through processing of the signal and registrations of patterns on the mask may be inspected based on positional information regarding the e-beam irradiators.

15 Claims, 25 Drawing Sheets

(56) References Cited

U.S. PATENT DOCUMENTS

2012/0138796 A1\* 6/2012 Sasajima ................ H01J 37/28
250/311
2017/0357153 A1 12/2017 Platzgummer \* cited by examiner Pa1 →

Pa2 →

Pa3 →

Pr1 →

Pr2 →

Pr3 →

↑ ⇒ → ≡ ↖
$\Delta'_A - \Delta_A = R_A + (e_s)$

↗ ⇒ ↖ ≡ →
$\Delta'_B - \Delta_B = R_B + (e_s)$

↗ ⇒ ↙ ≡ ↗
$\Delta'_C - \Delta_C = R_C + (e_s)$ $R_A \approx R_A + (e_s) - R_{av}$ ↖

$R_B \approx R_B + (e_s) - R_{av}$ →

$R_C \approx R_C + (e_s) - R_{av}$ ↗

MASK INSPECTION APPARATUSES AND METHODS, AND METHODS OF FABRICATING MASKS INCLUDING MASK INSPECTION METHODS

CROSS-REFERENCE TO RELATED APPLICATIONS

This application claims the benefits of priority under 35 U.S.C. § 119 to Korean Patent Application Nos. 10-2018-0138297, filed on Nov. 12, 2018, and 10-2019-0006928, filed on Jan. 18, 2019, in the Korean Intellectual Property Office, the disclosures of which are incorporated by reference herein in their entireties.

TECHNICAL FIELD

The present disclosure relates to mask inspection apparatuses and mask inspection methods, and more particularly, to mask inspection apparatuses and mask inspection methods for inspecting a registration of a pattern on a mask.

BACKGROUND

In general, a semiconductor device may be manufactured through repetitive unit processes including a photolithography process, a thin film deposition process, and an etching process. From among the processes, the photolithography process is a typical main process determining a critical dimension (CD) of a semiconductor device. The photolithography process may include a photoresist application process, an exposure process, and a development process. The exposure process may be a process for transferring patterns provided on a mask onto a photoresist on a wafer. The patterns on the mask may have registration deviations depending on changes of intervals therebetween and directions during a manufacturing process. Therefore, prior to the exposure process, registration inspection of the patterns on the mask may be performed.

SUMMARY

The inventive concepts of the present disclosure provides mask inspection apparatuses and mask inspection methods that enable quick and accurate inspection of a registration of a pattern on a mask while a defect of the mask and the registration of the pattern on the mask are inspected together.

According to some aspects of the inventive concepts, a mask inspection apparatus may include a stage configured to receive a mask to be inspected; an e-beam array including a plurality of e-beam irradiators configured to irradiate e-beams to the mask and detectors configured to detect electrons emitted from the mask; and a processor configured to process signals from the detectors, wherein a defect of the mask is detected through processing of the signal and registrations of patterns on the mask are inspected based on positional information regarding the e-beam irradiators.

According to some aspects of the inventive concepts, a mask inspection apparatus may include a stage configured to receive a mask for inspection; a plurality of e-beam irradiation detecting units each including an e-beam irradiator configured to irradiate an e-beam onto the mask and a detector configured to detect electrons emitted from the mask; and a substrate holder on which the plurality of e-beam irradiation detecting units are arranged in a one-dimensional or two-dimensional array form, wherein a defect of the mask is detected by processing a signal from the detector and registrations of patterns on the mask are inspected based on positional information regarding the plurality of e-beam irradiation detecting units.

According to some aspects of the inventive concepts, there is provided a mask inspection method that may include measuring a position of a reference pattern on a reference mask by using a plurality of e-beam irradiation detecting units each including an e-beam irradiator and a detector and calculating a first offset value for each e-beam irradiation detecting unit indicating a degree that the e-beam irradiator is off from a normal position of a substrate holder; measuring a position of a pattern on a mask for inspection using the e-beam irradiation detecting units and calculating a second offset value for each e-beam irradiation detecting unit indicating a difference between a measured position of the pattern on the mask and a position of the pattern on the mask on the design; and calculating a registration of the pattern on the mask by subtracting the first offset values from the second offset values, wherein detection of a defect of the mask and inspection of the registration of the pattern on the mask are performed simultaneously.

According to some aspects of the inventive concepts, a mask inspection method may include measuring a position of a reference pattern on a reference mask using a plurality of e-beam irradiation detecting units each including an e-beam irradiator and a detector and calculating a first offset value for each e-beam irradiation detecting unit indicating a degree that the e-beam irradiator is off from a normal position of a substrate holder; forming a pattern on a mask for inspection; measuring a position of a pattern on the mask using the e-beam irradiation detecting units and calculating a second offset value for each e-beam irradiation detecting unit indicating a difference between a measured position of the pattern on the mask and a position of the pattern on the mask on the design; calculating a registration of the pattern on the mask by subtracting the first offset values from the second offset values; and performing subsequent operations for the mask when the registration is within a permissible range, wherein, in the calculating of the registration of the pattern on the mask, a defect of the mask and the registration of the mask are inspected together.

BRIEF DESCRIPTION OF THE DRAWINGS

Aspects of the present disclosure will be more clearly understood from the following detailed description taken in conjunction with the accompanying drawings in which.

DETAILED DESCRIPTION

Figure 1A:
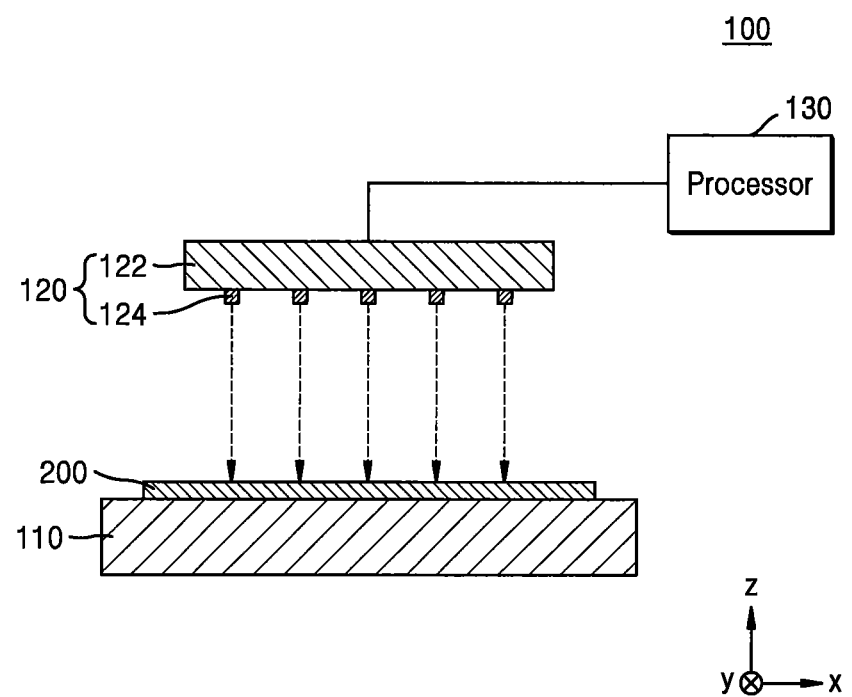
FIGS. 1A to 1D are respectively a conceptual diagram showing a mask inspection apparatus, a conceptual diagram showing an e-beam irradiator, a plan view of an e-beam array, and a conceptual diagram showing a scanning process using an e-beam array according to some example embodiment.
Figure 1B:
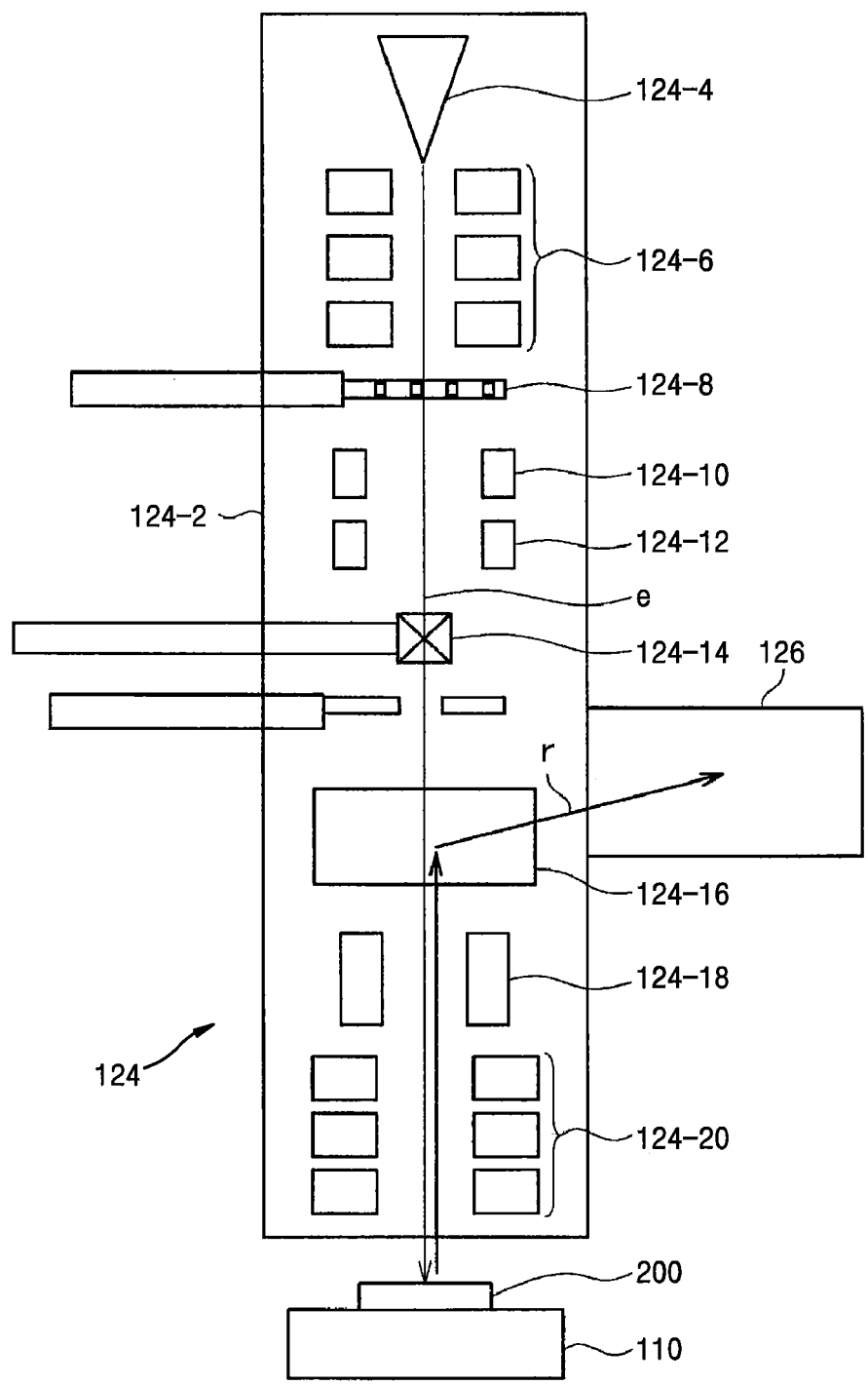

FIGS. 1A to 1D are respectively a conceptual diagram showing a mask inspection apparatus, a conceptual diagram showing an e-beam irradiator, a plan view of an e-beam array, and a conceptual diagram showing a scanning process using an e-beam array according to some example embodiments.

Referring to FIGS. 1A to 1D, a mask inspection apparatus 100 according to the present disclosure may include a stage 110, an e-beam array 120, and a processor 130.

On the stage 110, a mask 200 for inspection may be disposed. The stage 110 may support the mask 200. Also, the stage 110 may move the mask 200 in a first direction (x direction) and/or a second direction (y direction) on the x-y plane by moving in the first direction (x direction) and/or the second direction (y direction). Furthermore, the stage 110 may also move in a third direction (z direction), and as such the mask 200 may move in the third direction (z direction). The mask 200 may be totally scanned during an inspection of the mask 200 as the stage 110 moves in the first direction (x direction) and/or the second direction (y direction). An inspection distance between an e-beam irradiator 124 in the e-beam array 120 and the mask 200 may be appropriately adjusted as the stage 110 moves in the third direction (z direction). Herein, movement in a direction such as the first direction may include positive (e.g., +x) and/or negative movement (−x) in the direction.

The e-beam array 120 may include a substrate holder 122, the e-beam irradiator 124, and a detector 126. The detector 126 is shown only in FIGS. 1B to 1D and, for convenience of illustration, is omitted in FIG. 1A. In some embodiments, the e-beam irradiator 124 and the detector 126 may be considered as one e-beam irradiation detecting unit (EDU) based on functions and disposed locations thereof.

The substrate holder 122 may accommodate and support a plurality of e-beam irradiators 124. As shown in FIG. 1C, the horizontal section of the substrate holder 122 may have a rectangular shape. However, the shape of the horizontal section of the substrate holder 122 is not limited to a rectangle.

The e-beam irradiator 124 may generate an e-beam and irradiate the e-beam to a specific position of the mask 200. The e-beam irradiator 124 may include a housing 124-2 and various optical elements arranged within the housing 124-2. For example, the e-beam irradiator 124 may include an electron gun 124-4, a condenser lens 124-6, an aperture 124-8, an optical axis adjuster 124-10, a blanking electrode 124-12, a valve 124-14, a beam splitter 124-16, a scan electrode 124-18, and an object lens 124-20, and the like in the order stated within the housing 124-2 in a downward direction toward the mask 200. The condenser lens 124-6, the aperture 124-8, the optical axis adjuster 124-10, the blanking electrode 124-12, the beam splitter 124-16, the scan electrode 124-18, and the object lens 120-20 may be concentrically arranged around a center axis of the e-beam irradiator 124.

The functions of the components in the e-beam irradiator 124 will be briefly described.

The electron gun 124-4 may be a Schottky type electron gun or a thermoelectric electron gun, as examples. By applying an adjusted acceleration voltage to the electron gun 124-4, an e-beam e may be generated and emitted. The condenser lens 124-6 and the aperture 124-8 may condense the e-beam e emitted from the electron gun 124-4 and convert the same into a desired e-beam current. The optical axis adjuster 124-10 may adjust the astigmatism of a beam, a beam position on the optical axis, and a beam irradiation position on a mask. The blanking electrode 124-12 may temporarily block the e-beam e to not irradiate, such that the e-beam e is not irradiated to the mask 200 on the stage 110. For example, the blanking electrode 124-12 may bend the e-beam e emitted from the electron gun 124-4 to prevent the e-beam e from being irradiated to the mask 200. The valve 124-14 may divide the interior of the e-beam irradiator 124 into several regions. For example, the valve 124-14 may divide the interior of the e-beam irradiator 124 into three regions and, when a defect occurs in a first region, the valve 124-14 may prevent a second region and a third region from being exposed to the atmosphere. In some embodiments, the valve 124-14 may be omitted from the e-beam irradiator 124.

The beam splitter 124-16 may transmit the e-beam e from the electron gun 124-4 therethrough and irradiate the e-beam e to the mask 200 and may also bend the traveling direction of electrons emitted from the mask 200 to be incident to the detector 126. The beam splitter 124-16 will be described below in more detail in the description of the detector 126.

The scan electrode 124-18 may deflect the e-beam (e) by externally applying a high frequency control signal, e.g., a high frequency current, from 0 V to 400 V. The e-beam e may scan on the main surface of the mask 200 in an arbitrary direction by deflecting the e-beam e through the scan electrode 124-18. The high frequency control signal may be introduced from the outside of the e-beam irradiator 124 to the scan electrode 124-18. In some embodiments, the scan electrode 124-18 may be omitted.

The object lens 124-20 may focus the e-beam e that is deflected by the scan electrode 124-18 or passed through the beam splitter 124-16 onto the main surface of the mask 200.

The e-beam irradiator 124 having the above-described configuration causes the e-beam e emitted from the electron gun 124-4 to be irradiated onto the main surface of the mask 200 and also causes a secondary e-beam r reflecting a shape, a composition, a charging state, and the like of a pattern on the mask 200 to be detected by the detector 126, and thus a defect of the pattern on the mask 200 may be detected. Here, the secondary e-beam r may include secondary electrons or Auger electrons emitted within the mask 200 or reflected electrons generated as the e-beam e is reflected by the mask 200.

The optical elements in the e-beam irradiator 124 may be arranged in appropriate regions corresponding to a degree of vacuum required. For example, the electron gun 124-4 that emits the e-beam e or the condenser lens 124-6 may be arranged in a region with the greatest vacuum. The aperture 124-8, the optical axis adjuster 124-10, and the blanking electrode 124-12 may be arranged in a region or regions having a medium degree of vacuum. The beam splitter 124-16, the scan electrode 124-18, and the object lens 124-20 may be arranged in a region or regions with a low or lowest degrees of vacuum. Accordingly, different elements in the e-beam irradiator 124 may be located in regions having different degrees of vacuum. The stage 110 having the mask 200 disposed thereon, and/or the detector 126 for detecting the secondary e-beam r, may also be arranged in a region or regions with a low or lowest degrees of vacuum. In some embodiments, the optical elements within the e-beam irradiator 124, the stage 110, and the detector 126 may all be arranged in high-vacuum regions.

A plurality of e-beam irradiators 124 may be arranged on the substrate holder 122. For example, as shown in FIG. 1C, the e-beam irradiators 124 or EDUs may be disposed on the substrate holder 122 in a 4×5 2-dimensional array form. However, in the e-beam array 120, the arrangement form of the e-beam irradiators 124 is not limited to the 4×5 2-dimensional array form, and may be an m-by-n 2-dimensional array or an m-by-1 or 1-by-n 1-dimensional array. The arrangement form of the e-beam irradiators 124 in the e-beam array 120 will be described below in more detail with reference to FIGS. 7A and 7B.

In the mask inspection apparatus 100 according to some of the present embodiments, the mask 200 may be inspected by using the e-beam array 120. A reference mask (see 200R of FIG. 2A) may be used to calculate positional information regarding the e-beam irradiator 124 in the e-beam array 120. The calculated positional information regarding the e-beam irradiator 124 may be used to check the registration of a pattern on the mask 200. The positional information regarding the e-beam irradiator 124 and inspection of the registration of a pattern on the mask 200 is described in more detail in the description with reference to FIGS. 2A through 6C.

Figure 1C:
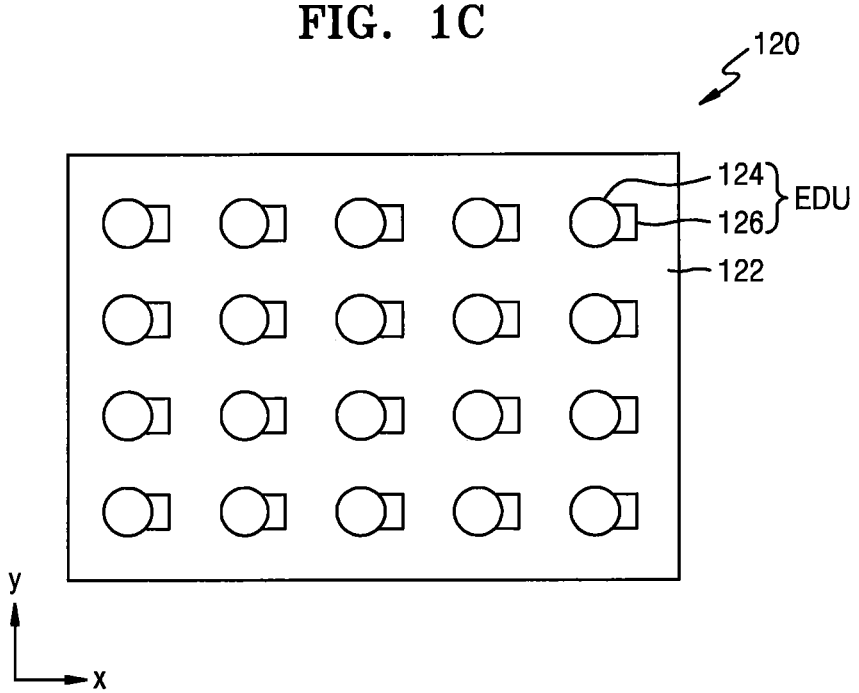
Figure 1D:
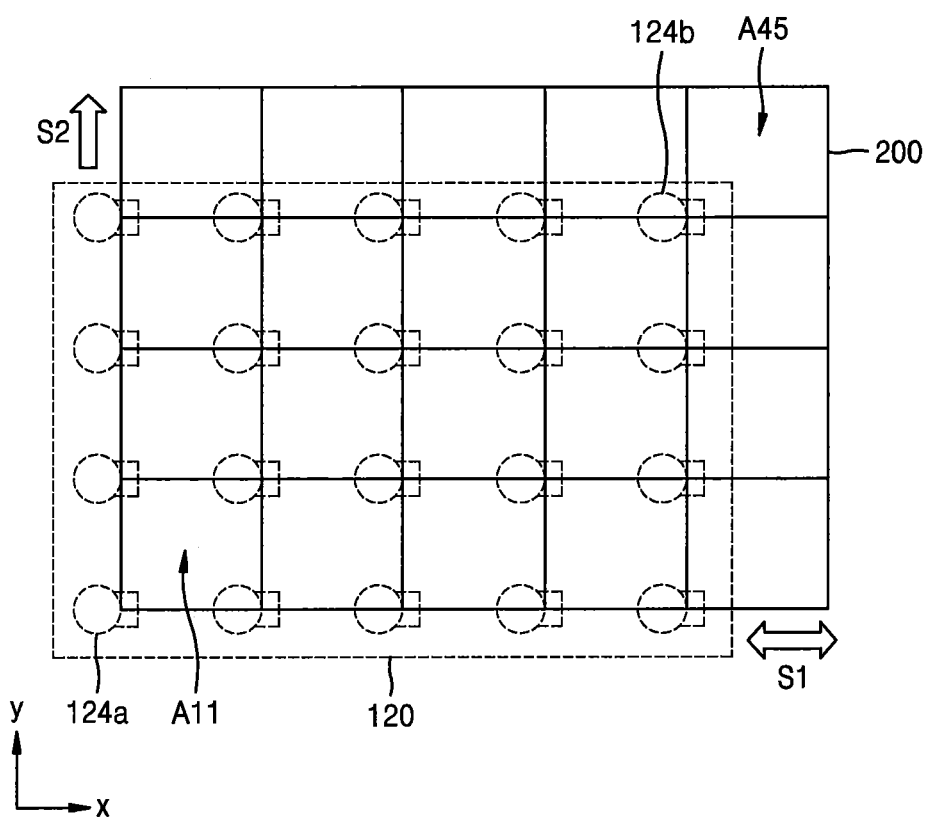

To briefly describe a scanning operation with respect to the mask 200 by the e-beam irradiator 124, as shown in FIG. 1D, the e-beam array 120 including the e-beam irradiators 124 arranged in a 2-dimensional array form may be disposed on the mask 200. Each of the e-beam irradiators 124 may scan a certain region of the mask 200. For example, a first e-beam irradiator 124a at the bottom left may scan a first region A11 on the mask 200, and a second e-beam irradiator 124b at the top right may scan a second region A45 on the mask 200.

A scanning may include a first scanning S1 in the first direction (x direction) and a second scanning S2 in the second direction (y direction). For example, first, the first scanning S1 may be performed by an e-beam from the e-beam irradiator 124 in the first direction (x direction). The first scanning S1 may be performed by deflection of the e-beam by the scan electrode 124-18. However, in some embodiments, the first scanning S1 may be performed by a movement of the stage 110. For reference, in the case of a scanning by the movement of the stage 110, the direction of the first scanning S1 may be opposite to a moving direction of the stage 110. When the scanning corresponding to the width of one region on the mask 200, e.g., the first region A11, in the first direction (x direction) is completed, the stage 110 may move in the second direction (y direction). Here, the moving direction of the stage 110 may be opposite to the direction of the second scanning S2, and a moving distance of the stage 110 may correspond to a part of the length of the second scanning S2.

Then, an e-beam from the e-beam irradiator 124 may perform a second first scanning S1 in the first direction (x direction). The direction of the second first scanning S1 may be opposite to the direction of the first scanning S1. Then, when the scanning corresponding to the width of one region on the mask 200 in the first direction (x direction) is completed again, the stage 110 may move in the second direction (y direction). When the movement of the stage 110 corresponding to the width of the mask 200 in the second direction (y direction) is completed through a process as described above, that is, when the second scanning S2 is completed, the total scanning of the mask 200 may be completed.

In some embodiments, the first scanning S1 and the second scanning S2 may be performed simultaneously. For example, the stage 110 may move in the second direction (y direction) at a very slow speed during the first scanning S1 by the scan electrode 124-18. In such a case, an actual scanning may proceed in a diagonal direction between the first direction (x direction) and the second direction (y direction).

The detector 126 may detect the secondary e-beam r emitted from the mask 200 as the e-beam e is irradiated to the mask 200. The energy resolution of the detector 126 may be, for example, 1 eV or less. However, the energy resolution of the detector 126 is not limited thereto. For example, the detector 126 may include a semiconductor detector, a scintillator+ photomultiplier tube (PMT), a channel electron multiplier (CEM), a micro-channel plate, or the like. The detector 126 may amplify input electrons and output amplified electrons as current signals. Also, although not shown, a preamplifier and an analog-to-digital converter (ADC) may be coupled to an output of the detector 126. The preamplifier may change a current signal from the detector 126 to a voltage signal and amplify the voltage signal, and the ADC may convert the amplified voltage signal to a digital signal. A digital signal from the ADC may be transmitted to the processor 130.

The beam splitter 124-16 may split the secondary e-beam r emitted from the mask 200 from the optical axis and guide the secondary e-beam r to be incident to the detector 126. In some embodiments, beam emission and beam detection may be performed simultaneously. For example, the beam splitter 124-16 may optimally adjust a magnetic field and an electric field to guide the e-beam e emitted from the electron gun 124-4 to reach the mask 200 without bending the e-beam e and, simultaneously, guide the secondary e-beam r emitted from the mask 200 to reach the detector 126 by bending the secondary e-beam r in a direction off the center axis of the e-beam irradiator 124.

In some embodiments, the processor 130 may include an energy analyzer, a detecting unit, a storage unit, and the like. The energy analyzer may extract the energy and spectral intensity of the secondary e-beam r from the detector 126, and the detecting unit may detect a defect of the mask 200 based on data from the energy analyzer. The detecting unit may also calculate the positions of patterns on the mask 200. In some embodiments, the detecting unit may be separated into a defect detecting unit and a position detecting unit. The storage unit may store information regarding previous defects, positional information regarding patterns on a design, and the like. The detecting unit may detect a defect of the mask 200 by using information stored in the storage unit and may also calculate positions of patterns on the mask 200.

Components of the processor 130 may include a processing unit like hardware or a CPU and a program (software) for operating the processing unit. The processor 130 may include, for example, a general personal computer (PC), a workstation, a super computer, or the like. The processor 130 may detect a pattern on the mask 200 and/or a defect through the above-described process. In addition, the processor 130 may calculate positional information regarding the patterns on the mask 200 by comparing the positions of detected patterns with the positions of patterns on the design.

The mask inspection apparatus 100 according to some of the example embodiments may inspect the mask 200 by using the e-beam array 120 in which the e-beam irradiators 124 are arranged in a 1-dimensional or 2-dimensional array form. Accordingly, in some embodiments the mask inspection apparatus 100 may calculate the positional information regarding the e-beam irradiators 124 by using a reference mask (see 200R in FIG. 2A) and may also quickly and accurately inspect the registration of the patterns on the mask 200 based on the positional information regarding the e-beam irradiators 124 and the positional information regarding the patterns on the mask 200 for inspection. In some embodiments, the mask inspection apparatus 100 may also perform defect inspection of the mask 200 based on the basic function of the e-beam irradiator 124.

FIGS. 2A to 2E are conceptual diagrams showing a process of calculating a first offset value for an e-beam irradiator in an e-beam array by using a reference mask in the mask inspection apparatus of FIG. 1A. Descriptions thereof will be given below with reference to FIGS. 1A to 1D together.

Figure 2A:
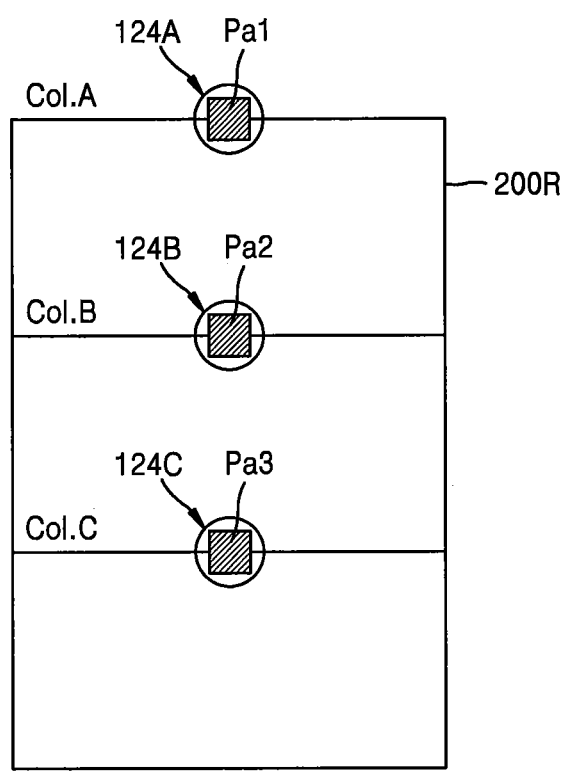
FIGS. 2A to 2E are conceptual diagrams showing a process of calculating a first offset value for an e-beam irradiator in an e-beam array by using a reference mask in the mask inspection apparatus of FIG. 1A.

Referring to FIGS. 2A through 2E, first, first to third pattern regions Pa1, Pa2, and Pa3 on a reference mask 200R are inspected through the e-beam irradiator 124 of the e-beam array 120. Although only three column regions Col.A, Col.B, and Col.C are shown in FIG. 2A, it is merely for convenience of explanation, and there may be actually dozens of column regions on the reference mask 200R. Here, a column region on the reference mask 200R may correspond to a region that may be scanned by one e-beam irradiator 124.

The first to third pattern regions Pa1, Pa2, and Pa3 are located at the boundaries of the three column regions Col.A, Col.B, and Col.C, and the first to third pattern regions Pa1, Pa2, and Pa3 may be inspected simultaneously through three e-beam irradiators 124A, 124B, and 124C. In each of the first to third pattern regions Pa1, Pa2, and Pa3, a reference pattern Mr or a reference mark may be formed. The reference pattern Mr formed in each pattern region Pa1, Pa2, and Pa3 may be at a reference position and may be already verified. In other words, the reference patterns Mr in the first to third pattern regions Pa1, Pa2, and Pa3 on the reference mask 200R may be accurately positioned at the reference position, which is a position on the design.

In the reference mask 200R, the reference patterns Mr of the first to third pattern regions Pa1, Pa2, and Pa3 may all have the same shape. Since the reference mask 200R is not actually used for exposure, unlike the general mask 200, various patterns need not be formed on the entire surface of the reference mask 200R. Therefore, only the reference patterns Mr of the same type may be arranged at a required position, e.g., the reference position, on the reference mask 200R.

When the three e-beam irradiators 124A, 124B, and 124C are arranged at normal positions in the substrate holder 122, the positions of the reference patterns Mr of the first to third pattern regions Pa1, Pa2, and Pa3, measured by the three e-beam irradiators 124A, 124B, and 124C, may match (e.g., may exactly match) positions on the design, e.g., reference positions. However, in some situations at least one of the three e-beam irradiators 124A, 124B, and 124C may be placed at an abnormal position within the substrate holder 122, for example due to an assembly process of the e-beam array 120 or surrounding physical factors. Herein, an abnormal position may include all cases in which an e-beam is unable to be irradiated to a normal point of the mask 200, such as cases where the e-beam irradiator 124 itself is out of its normal position, cases where, although the e-beam irradiator 124 is at a normal position, the e-beam irradiator 124 is inclined with respect to the bottom surface of the substrate holder 122, and other cases.

When one or more of the three e-beam irradiators 124A, 124B, and 124C are at abnormal positions in the substrate holder 122, positions of one or more of the reference patterns Mr of the first to third pattern regions Pa1, Pa2, and Pa3, measured by the three e-beam irradiators 124A, 124B, and 124C, may differ from positions on the design, that is, the reference positions.

Figure 2B:
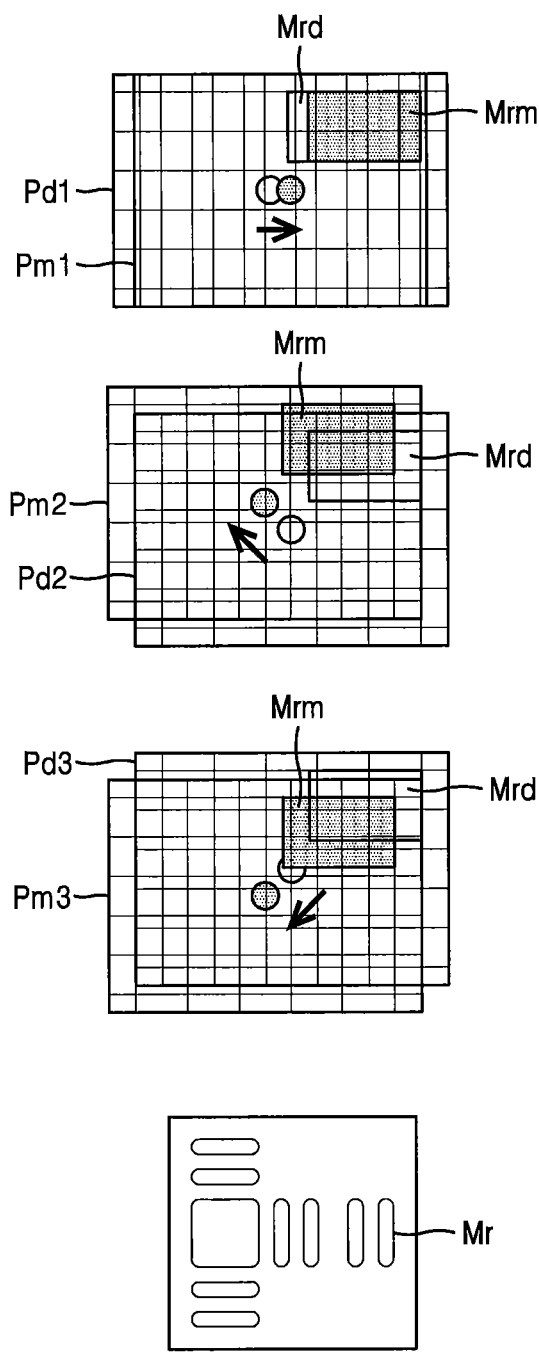

In FIG. 2B, the first to third pattern regions Pa1, Pa2, and Pa3 are enlarged for illustration. In the first to third pattern regions Pa1, Pa2, and Pa3, measured reference patterns Mrm are slightly off from reference patterns Mrd at reference positions. In FIG. 2B, the reference pattern Mr is shown as a rectangle at the upper right corner, and the hatched rectangle may correspond to the measured reference pattern Mrm and the unhatched rectangle may correspond to the reference pattern Mrd at the reference position.

FIG. 2B shows both the measured first to third pattern regions Pm1, Pm2, and Pm3 and first to third pattern regions Pd1, Pd2, and Pd3 at the reference positions. Also, a more specific shape of the reference pattern Mr is shown below a measured third pattern region Pm3 and the third pattern region Pd3 at a reference position. Small circles at the center represent the center portion of the first to third pattern regions Pa1, Pa2, and Pa3, with the hatched circle representing the center of the measured first to third pattern regions Pm1, Pm2, and Pm3 and the unhatched circle representing the center of the first to third pattern regions Pd1, Pd2, and Pd3 at the reference positions. Each arrow in the first to third pattern regions Pa1, Pa2, and Pa3 corresponds to a vector indicating a degree that the measured reference pattern Mrm is off from the reference pattern Mrd at the reference position in a magnitude and a direction.

Figure 2C:
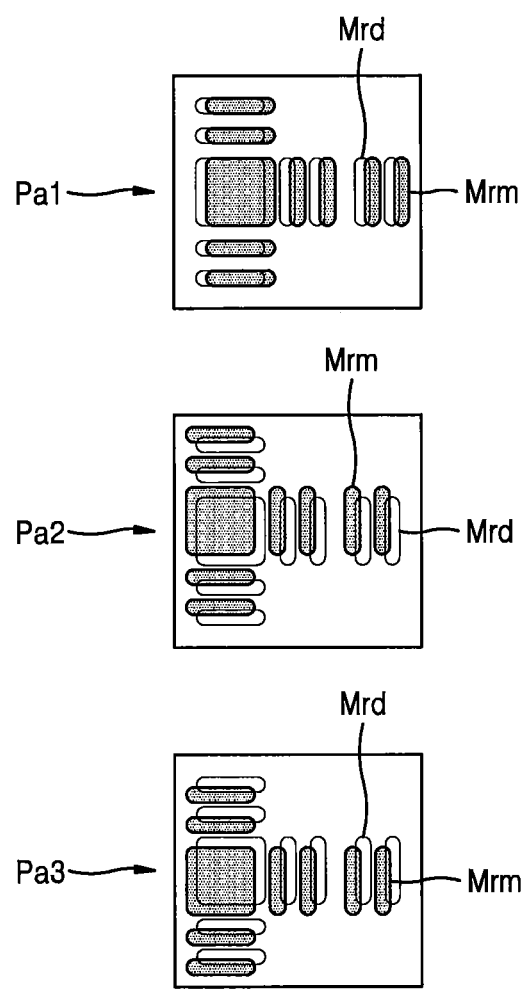

FIG. 2C shows an enlarged view of deviation of the reference pattern Mr in each of the first to third pattern regions Pa1, Pa2, and Pa3. In the same regard, the hatched portion may refer to the measured reference pattern Mrm, and the unhatched portion may refer to the reference pattern Mrd at the reference position.

Figure 2D:
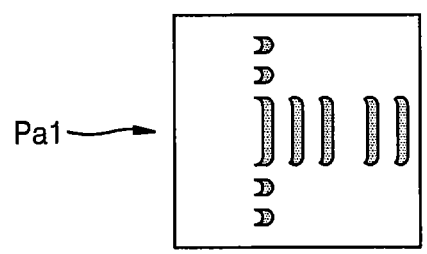
Figure 2D:
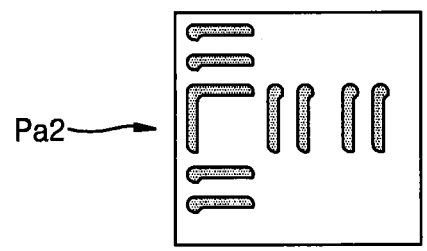
Figure 2D:
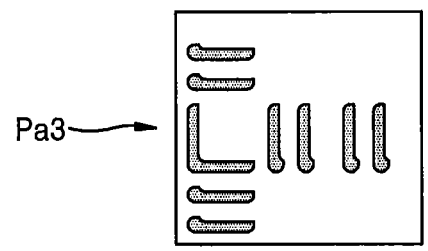
Figure 2E:
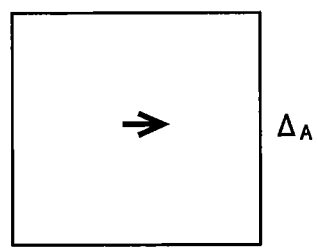
Figure 2E:
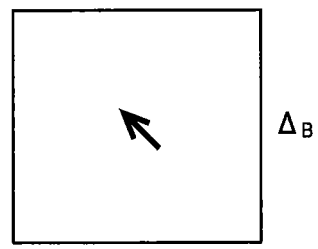
Figure 2E:
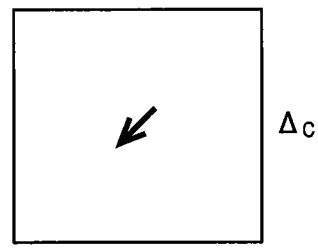

FIG. 2D shows remaining shapes obtained by subtracting the reference pattern Mrd at the reference position from the measured reference pattern Mrm, and FIG. 2E shows a vector indicating a degree that the reference pattern Mrd at the reference position needs to move to eliminate the shape shown in FIG. 2D. The degree that the reference pattern Mrd at the reference position needs to move may refer to first offset values ΔA, ΔB, and ΔC by which the three e-beam irradiators 124A, 124B, and 124C are off from the normal positions thereof in the substrate holder 122. The first offset values ΔA, Δ, and ΔC may correspond to positional information regarding the three e-beam irradiators 124A, 124B, and 124C in the substrate holder 122, respectively.

When the positions of patterns on the mask 200 are calculated by using the e-beam irradiator 124 without calculating the positional information regarding the e-beam irradiator 124, that is, without an offset value with respect to the normal position of the e-beam irradiator 124, an error may occur in an inspection of the registration of the patterns on the mask 200. For example, even when the patterns on the mask 200 are at the normal positions, it may be determined that the patterns are at abnormal position, and, even when the patterns on the mask 200 are at abnormal positions, it may be determined that the patterns are at the normal position. Therefore, an error may occur in an inspection of the registration of the patterns on the mask 200, and the error may be a serious error.

FIGS. 3A to 3E are conceptual diagrams showing the principle of calculating second offset values for patterns on a mask for inspection in the mask inspection apparatus of FIG. 1A. Descriptions thereof will be given below with reference to FIGS. 1A to 1D together, and descriptions already given above with reference to FIGS. 1A to 2E will be briefly given or omitted.

Figure 3A:
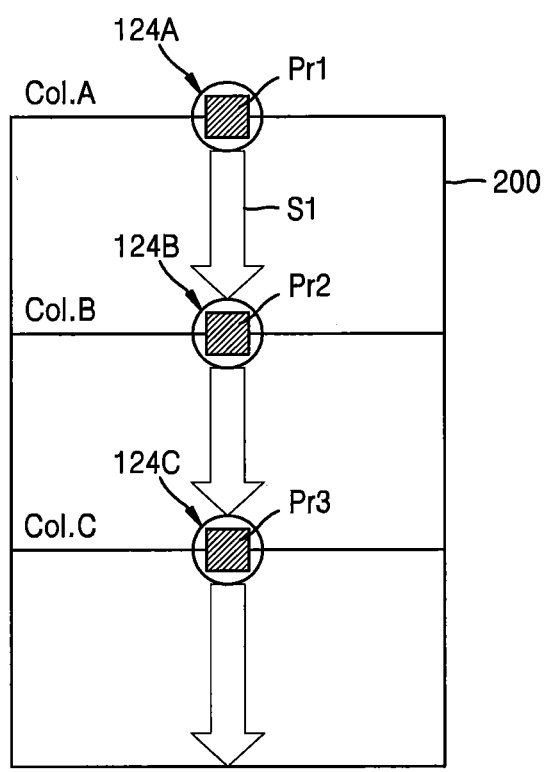
FIGS. 3A to 3E are conceptual diagrams showing the principle of calculating second offset values for patterns on a mask for inspection in the mask inspection apparatus of FIG. 1A.

Referring to FIGS. 3A through 3E, first, first to third pattern regions Pr1, Pr2, and Pr3 on the mask 200 for inspection are inspected through the three e-beam irradiators 124A, 124B, and 124C of the e-beam array 120. In FIG. 3A, the three column regions Col.A, Col.B, and Col.C on the mask 200 are identical to the three column regions Col.A, Col.B, and Col.C on the reference mask 200R of FIG. 2A.

The first to third pattern regions Pr1, Pr2, and Pr3 are located at the boundaries of the three column regions Col.A, Col.B, and Col.C, and the first to third pattern regions Pr1, Pr2, and Pr3 may be inspected simultaneously through three e-beam irradiators 124A, 124B, and 124C. On the other hand, in FIG. 3A, the arrow may correspond to the first scanning S1 of FIG. 1D, but is rotated by 90 degrees to face downward for convenience of illustration. For example, when inspections of the first to third pattern regions Pr1, Pr2, and Pr3 are completed, inspection of next pattern regions may be performed by moving an e-beam in the direction of the first scanning S1. Here, the e-beam may be moved through deflection of the scan electrode 124-18. However, in some embodiments, the e-beam may be moved through movement of the stage 110.

Various patterns Rp1, Rp2, and Rp3 are formed in the first to third pattern regions Pr1, Pr2, and Pr3, and the positions of the patterns Rp1, Rp2, and Rp3 may not be measured. However, positions of the patterns Rp1, Rp2, and Rp3 in the first to third pattern regions Pr1, Pr2, and Pr3 on the design may be stored in a storage unit of the processor 130. Since the mask 200 for inspection is a mask actually used for exposure, various patterns are formed on the entire surface of the mask 200 and may have shapes different from one another. Accordingly, the patterns Rp1, Rp2, and Rp3 in the first to third pattern regions Pr1, Pr2, and Pr3 may have shapes different from one another.

When the patterns Rp1, Rp2, and Rp3 in the first to third pattern regions Pr1, Pr2 and Pr3 are measured through the three e-beam irradiators 124A, 124B, and 124C, positions of measured patterns Rpm1, Rpm2, and Rpm3 may be different from the positions of patterns Rpd1, Rpd2, and Rpd3 on the design.

Figure 3B:
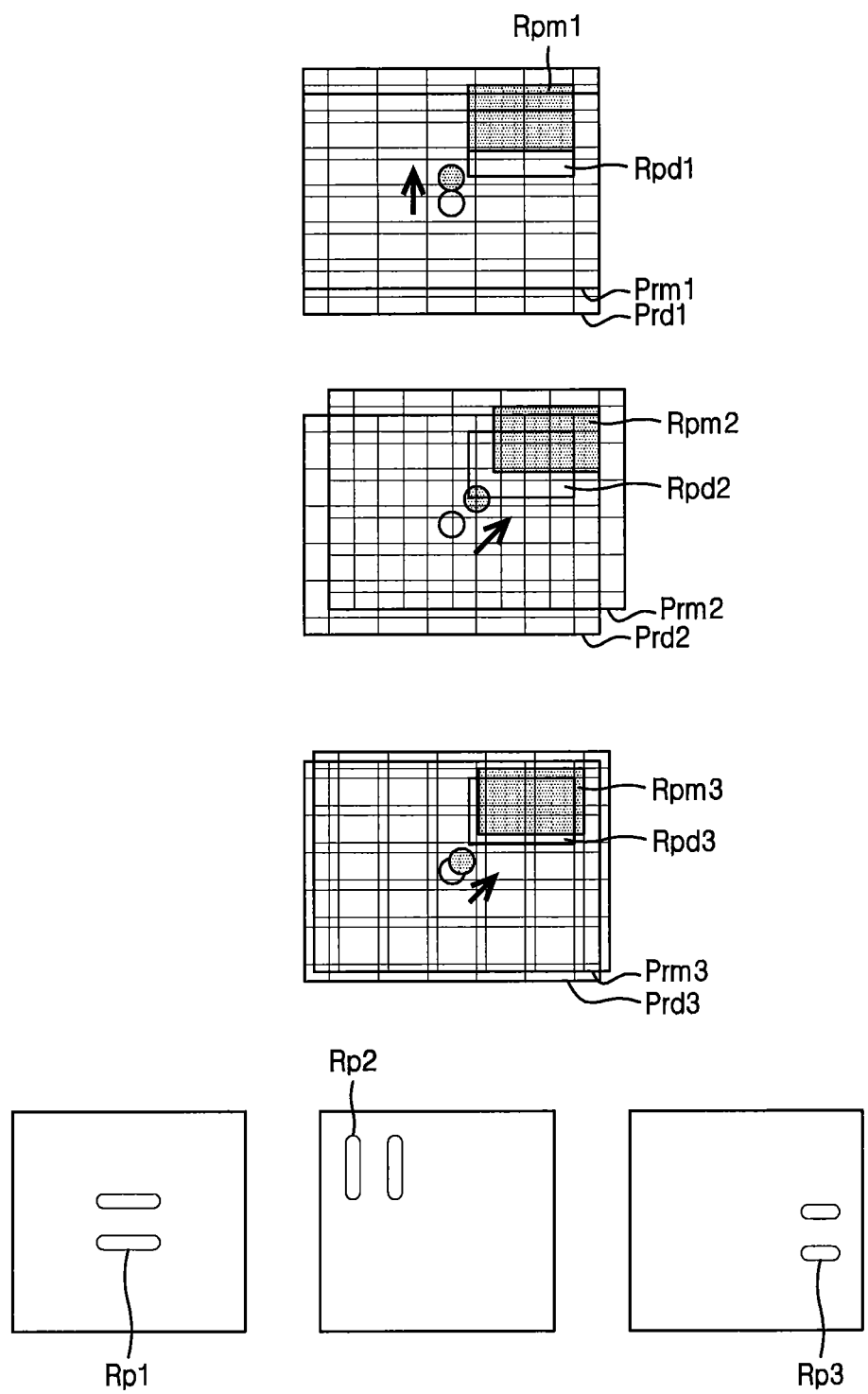

In FIG. 3B, the first to third pattern regions Pr1, Pr2, and Pr3 are enlarged. In the first to third pattern regions Pr1, Pr2, and Pr3, the measured patterns Rpm1, Rpm2, and Rpm3 are slightly off from the patterns Rpd1, Rpd2, and Rpd3 on the design. In FIG. 3B, the patterns in the upper right corner are represented by rectangles, wherein the hatched rectangles may correspond to the measured patterns Rpm1, Rpm2, and Rpm3, and the unhatched rectangles may correspond to the patterns Rpd1, Rpd2, and Rpd3 on the design.

FIG. 3B shows both measured first to third pattern regions Prm1, Prm2, and Prm3 and first to third pattern regions Prd1, Prd2, and Pdr3 on the design. Furthermore, more detailed shapes of the patterns Rp1, Rp2, and Rp3 in the first to third pattern regions Pr1, Pr2, and Pr3 are shown below the measured third pattern region Prm3 and the third pattern region Prd3 on the design. As described above with regard to the reference mask 200R of FIG. 2, the small circles at the center represent the centers of the first to third patterns regions Pr1, Pr2, and Pr3, the arrows in the first to third pattern regions Pr1, Pr2, and Pr3 represent vectors indicating respective degrees that the measured patterns Rpm1, Rpm2, and Rpm3 are off from the corresponding patterns Rpd1, Rpd2, and Rpd3 on the design in magnitudes and directions.

Figure 3C:
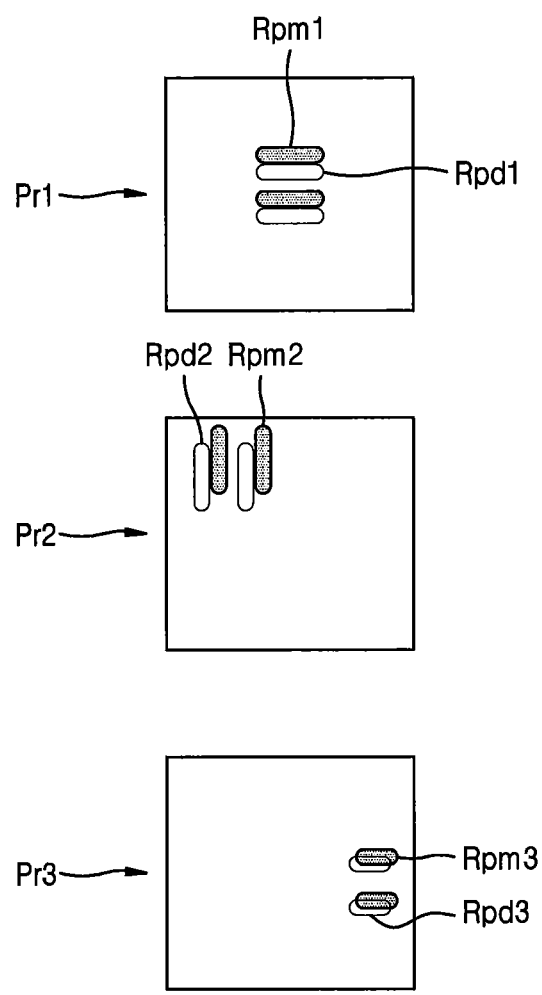

FIG. 3C is an enlarged view of the patterns Rp1, Rp2, and Rp3 deviated in the first to third pattern regions Pr1, Pr2, and Pr3, where the hatched portions may represent the measured patterns Rpm1, Rpm2, and Rpm3, and the unhatched portions may represent the patterns Rpd1, Rpd2, and Rpd3 on the design.

Figure 3D:
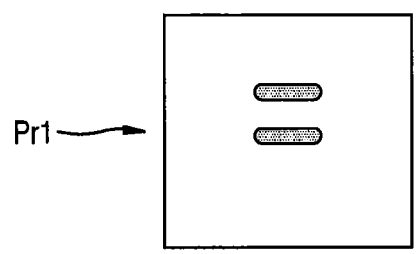
Figure 3D:
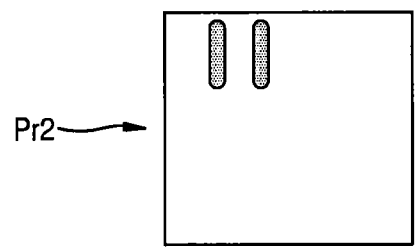
Figure 3D:
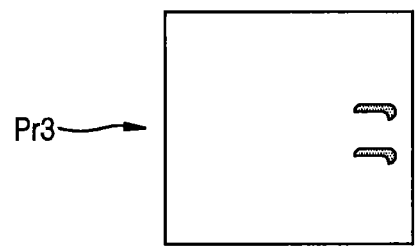
Figure 3E:
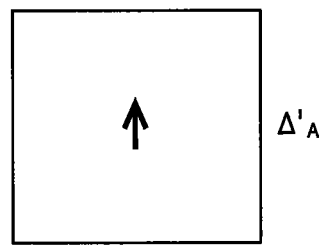
Figure 3E:
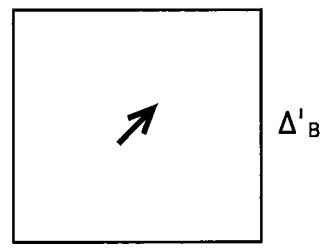
Figure 3E:
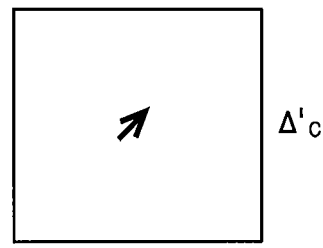

FIG. 3D shows remaining shapes obtained by subtracting the patterns Rpd1, Rpd2, and Rpd3 on the design respectively from the measured patterns Rpm1, Rpm2, and Rpm3, and FIG. 3E shows vectors indicating degrees that the patterns Rpd1, Rpd2, and Rpd3 on the design need to move to eliminate the shapes shown in FIG. 3D. The degrees that the patterns Rpd1, Rpd2, and Rpd3 on the design need to move may refer to second offset values $\Delta'A$, $\Delta'B$, and $\Delta'C$ by which the patterns Rp1, Rp2, and Rp3 of the first to third pattern regions Pr1, Pr2, and Pr3 are off from normal positions. The second offset values $\Delta'A$, $\Delta'B$, and $\Delta'C$ may correspond to positional information regarding the patterns Rp1, Rp2, and Rp3 on the mask 200. However, the second offset values $\Delta'A$, $\Delta'B$, and $\Delta'C$ may be unable to accurately represent the degrees that the patterns Rp1, Rp2, and Rp3 are off from the normal positions, that is, the positions thereof on the design. For example, the second offset values $\Delta'A$, $\Delta'B$, and $\Delta'C$ may include positional errors due to the three e-beam irradiators 124A, 124B, and 124C in the e-beam array 120 and/or include positional errors due to the stage 110.

Figure 4A:
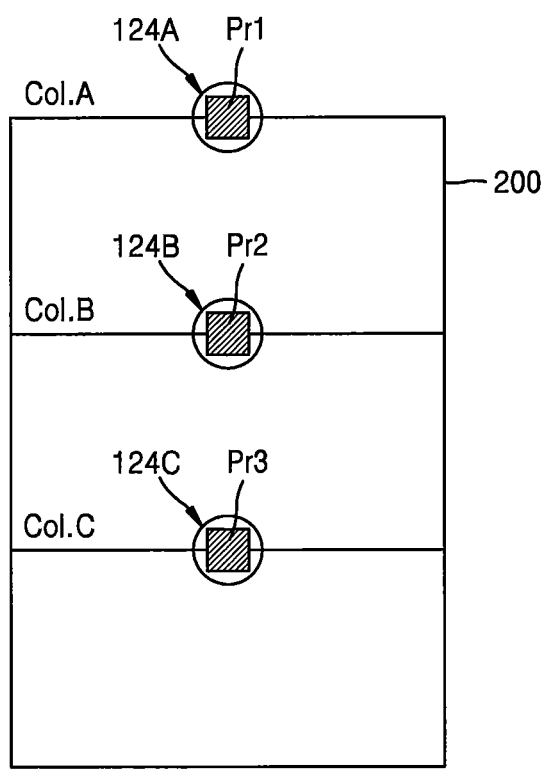
FIGS. 4A to 4C are conceptual diagrams showing the principle of calculating the registration of patterns on a mask by using first offset values and second offset values.
Figure 4B:
Figure 4C:
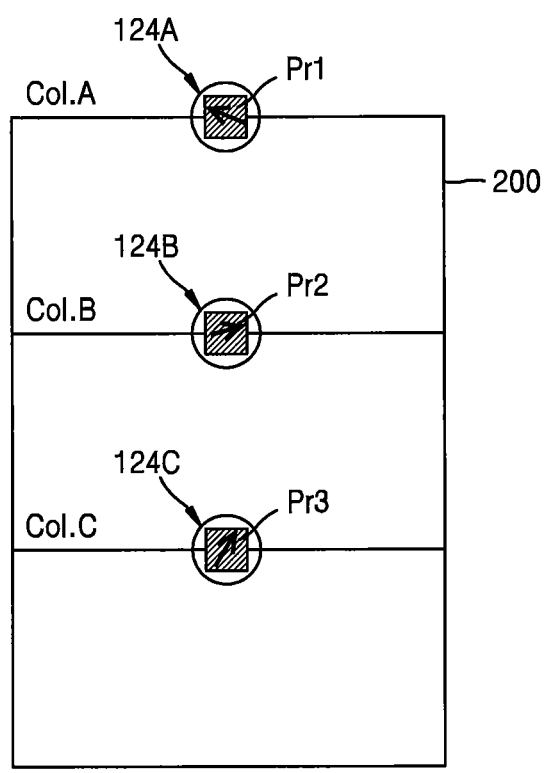

FIGS. 4A to 4C are conceptual diagrams showing the principle of calculating the registration of patterns on a mask by using first offset values (e.g., discussed with reference to FIGS. 2A to 2E) and second offset values (e.g., discussed with reference to FIGS. 3A to 3E). Descriptions thereof will be given below with reference to FIGS. 1A to 1D together, and descriptions already given above with reference to FIGS. 1A to 3E will be briefly given or omitted.

Referring to FIGS. 4A to 4C, as described above, the second offset values $\Delta'A$, $\Delta'B$, and $\Delta'C$ measured by the three e-beam irradiators 124A, 124B, and 124C of the e-beam array 120 with respect to the patterns Rp1, Rp2, and Rp3 in the first to third pattern regions Pr1, Pr2, and Pr3 include positional errors due to the three e-beam irradiators 124A, 124B, and 124C. Therefore, the first offset values $\Delta A$, $\Delta$, and $\Delta C$ regarding the three e-beam irradiators 124A, 124B, and 124C calculated in the description given above with reference to FIGS. 2A and 2E need to be reflected. Therefore, as shown in FIG. 4B, by subtracting the first offset values $\Delta A$, $\Delta B$, and $\Delta C$ from the second offset values $\Delta'A$, $\Delta'B$, and $\Delta'C$, the degrees that the patterns Rp1, Rp2, and Rp3 are off from the positions of patterns on the design, that is, registrations $R_A$, $R_B$, and $R_C$ of patterns, may be calculated. However, as described above, the second offset values $\Delta'A$, $\Delta B$, and $\Delta'C$ may include positional errors due to the stage 110. In FIG. 4B, the portion indicated as $(e_s)$ may correspond to a positional error due to the stage 110. Since a similar positional error $(e_s)$ due to the stage 110 may occur in all of the patterns Rp1, Rp2, and Rp3 in the same regard, the positional error $(e_s)$ is equally included in each of the second offset values Δ'A, Δ'B, and Δ'C and may still remain the same after the first offset values ΔA, Δ, and ΔC are subtracted from the second offset values Δ'A, Δ'B, and Δ'C.

Although the positional error ($e_s$) due to the stage 110 may be inspected through a separate measuring device, such an inspection procedure may become complicated and time-wise deteriorated. Therefore, in some embodiments, the positional error ($e_s$) due to the stage 110 may be calculated by using the following method. In the mask inspection apparatus 100 according to some embodiments, the number of e-beam irradiators 124 in the e-beam array 120 is n (n is an integer of two or greater), and thus n patterns may be measured. Also, when n is a relatively large value, an average δ of registrations of patterns may converge to almost zero. For example, when a first pattern is off to the right by 1 and a second pattern is off to the left by −1, the average thereof is zero.

On the other hand, a registration Ri regarding an i-th pattern by an i-th e-beam irradiator 124 (i is an integer; 1<=i<=n) may correspond to a value obtained by subtracting the positional error ($e_s$) due to the stage 110 from an i-th initial value Ri+($e_s$). Here, the i-th initial value Ri+($e_s$) may be defined as a value obtained by subtracting a first offset value Δi regarding the i-th e-beam irradiator 124 from a second offset value Δ'i obtained through the i-th e-beam irradiator 124. An average Rav of such initial values may be expressed by the following Equation (1).

$$Rav = [R1 + R2 +, \ldots, +R(n-1) + Rn]/n + (e_s) \qquad \text{Eq. (1)}$$

In Equation (1), [R1+R2+, . . . , +R (n−1)+Rn]/n represents an average δ of registrations of patterns and, as described above, may converge to zero. Therefore, the positional error ($e_s$) due to the stage 110 may be obtained as the average Rav of the initial values.

The lower portion of FIG. 4B shows that the registrations $R_A$, $R_B$, and $R_C$ of the patterns Rp1, Rp2, and Rp3 in the three column regions Col.A, Col.B, and Col.C may be calculated by subtracting the average Rav of initial values $R_A+(e_s)$, $R_B+(e_s)$, and $R_C+(e_s)$ from the initial values $R_A+(e_s)$, $R_B+(e_s)$, and $R_C+(e_s)$ and the right portion of FIG. 4B shows vectors corresponding to final registrations $R_A$, $R_B$, and $R_C$ of the patterns Rp1, Rp2, and Rp3. In addition, vectors regarding the registrations $R_A$, $R_B$, and $R_C$ of the patterns Rp1, Rp2, and Rp3 obtained in FIG. 4B are also shown in the first to third pattern regions Pr1, Pr2, and Pr3 in FIG. 4C.

Figure 5A:
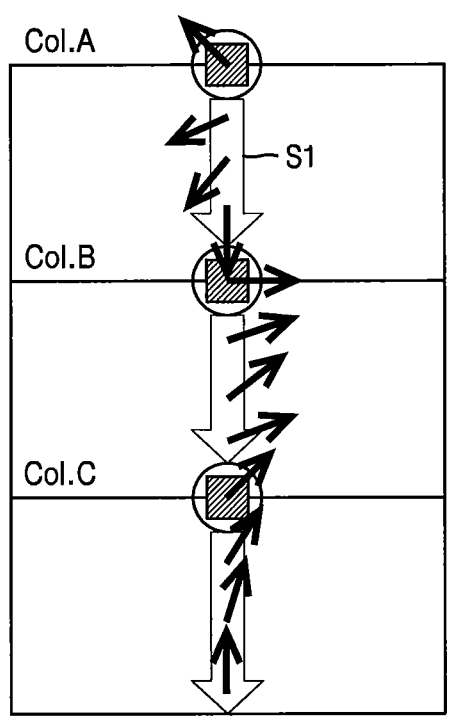
FIGS. 5A and 5B are conceptual diagrams showing a principle of calculating registrations of patterns for an entire mask through a scanning process.
Figure 5B:
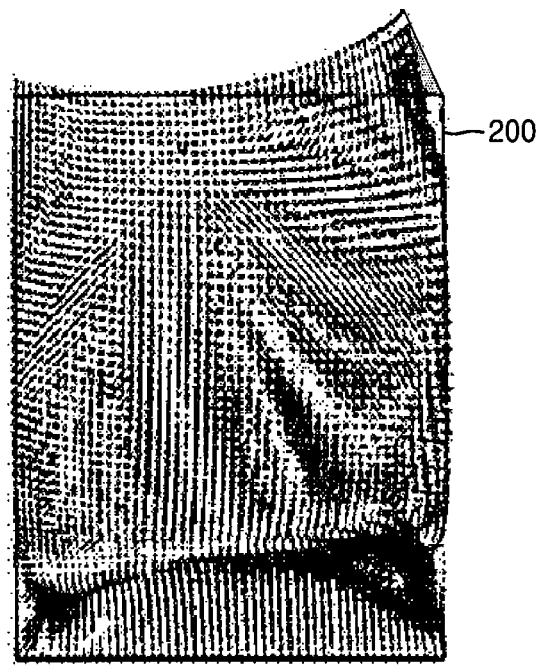

FIGS. 5A and 5B are conceptual diagrams showing a principle of calculating registrations of patterns for an entire mask through a scanning process. Descriptions thereof will be given below with reference to FIGS. 1A to 1D together, and descriptions already given above with reference to FIGS. 1A to 4C will be briefly given or omitted.

Referring to FIGS. 5A and 5B, after the registrations $R_A$, $R_B$, and $R_C$ of the patterns Rp1, Rp2, and Rp3 located at the boundaries of the column regions Col.A, Col.B, and Col.C are calculated, the first scanning S1 is performed in the direction indicated by the arrow, and registrations of patterns in next positions are calculated through the process of FIGS. 3A to 4C. Subsequently, registrations of patterns included within the widths of the column regions Col.A, Col.B, and Col.C in the direction of the first scanning S1 may be calculated by performing the first scanning S1. In FIG. 5A, registrations of patterns are shown as vectors in each of the column regions Col.A, Col.B, and Col.C. Since vectors of registrations of four patterns are shown in each of the column regions Col.A, Col.B, and Col.C, it may be understood that the registrations of the four patterns are calculated with respect to each of the column regions Col.A, Col.B, and Col.C in the direction of the first scanning S1. However, the number of patterns included in the column regions Col.A, Col.B, and Col.C in the direction of the first scanning S1 and the calculations of registrations thereof are not limited thereto.

After a scanning corresponding to the widths of the column regions Col.A, Col.B, an Col.C is completed in the direction of the first scanning S1, a movement corresponding to the second scanning S2 may be performed in a direction perpendicular to the direction of the first scanning S1, and then the first scanning S1 may be performed again in the direction of the first scanning S1. The second scanning S2 may be performed by a movement of the stage 110 as described above with reference to FIG. 1D. When the scanning corresponding to the widths of the column regions Col.A, Col.B, and Col.C is completed in the direction of the second scanning S2, total scannings of the column regions Col.A, Col.B, and Col.C and the entire mask 200 are completed, and registrations of patterns throughout the mask 200 may be calculated. FIG. 5B shows the registrations of the patterns throughout the mask obtained through the above-described process 3-dimensionally on the mask 200.

Figure 6A:
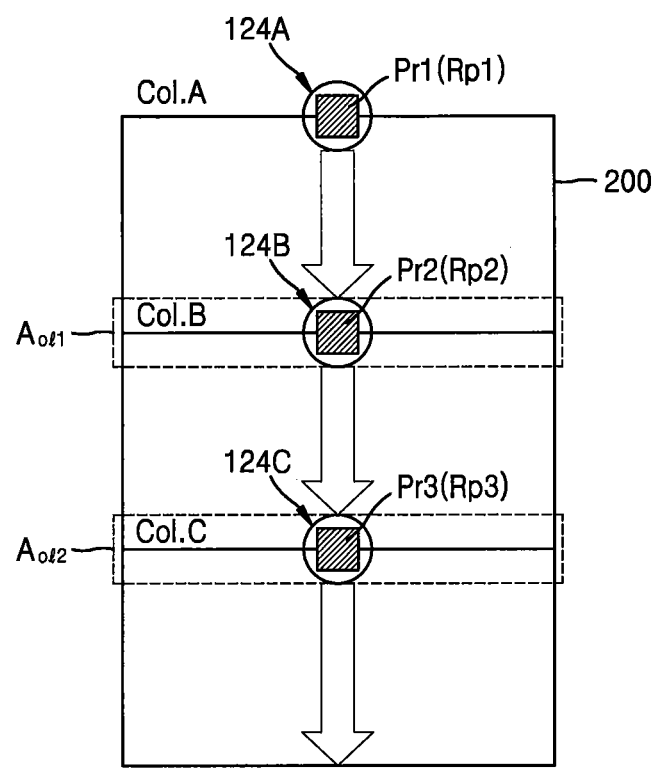
FIGS. 6A to 6C are conceptual diagrams showing a principle of checking an abnormality of an inspection by using an overlapping region during a scanning process on a mask.
Figure 6B:
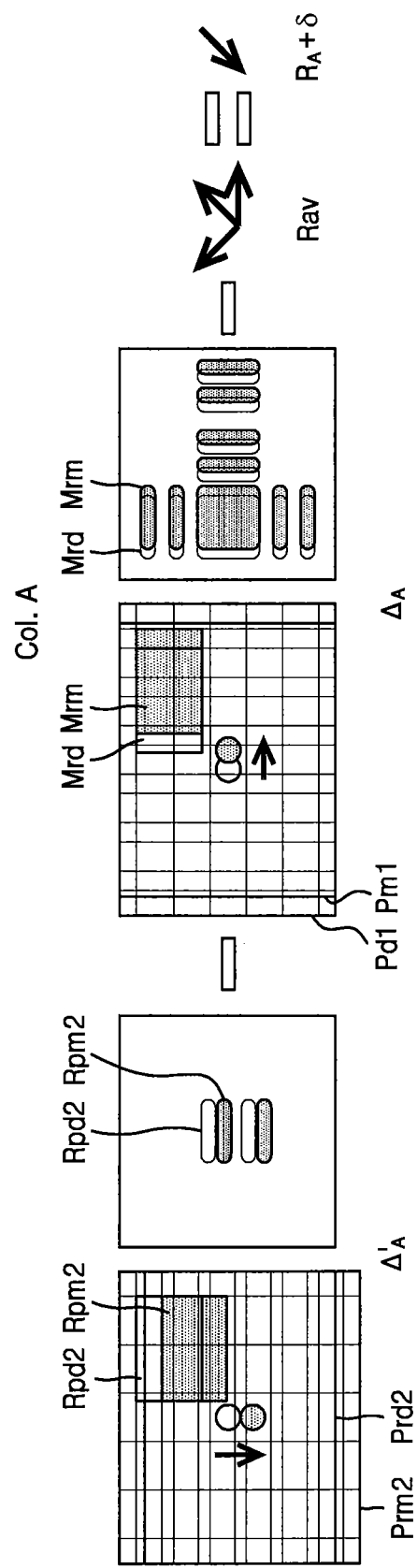
Figure 6C:
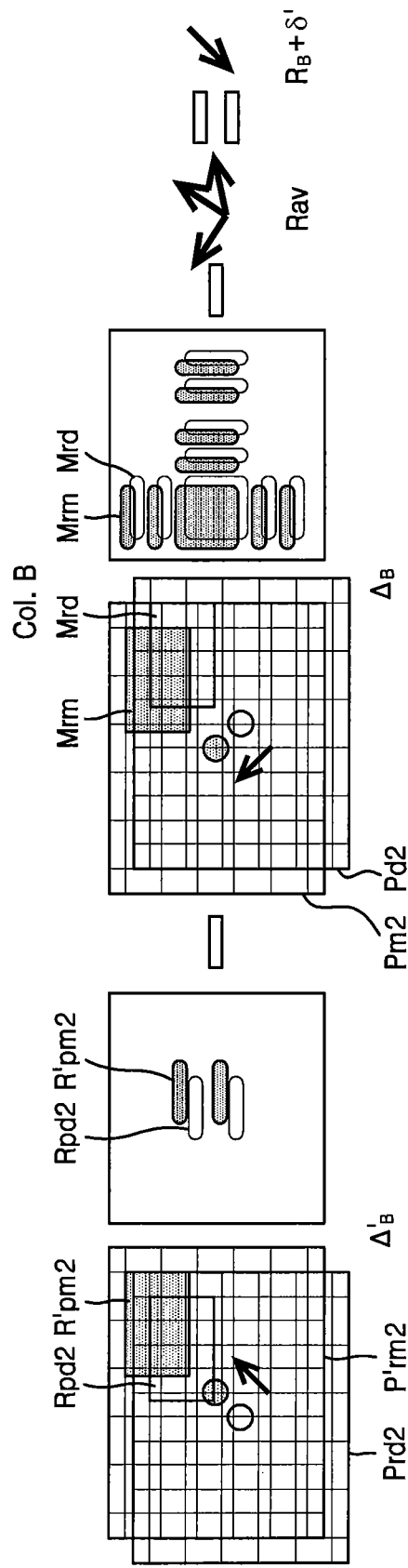

FIGS. 6A to 6C are conceptual diagrams showing a principle of checking an abnormality of an inspection by using an overlapping region during a scanning process on a mask. Descriptions thereof will be given below with reference to FIGS. 1A to 1D together, and descriptions already given above with reference to FIGS. 1A to 5B will be briefly given or omitted.

Referring to FIGS. 6A to 6C, when calculating registrations of patterns in the column regions Col.A, Col.B, and Col.C while performing the first scanning S1 in the direction indicated by the arrows, there may be overlapping regions Aol1 and Aol2 between the column regions Col.A, Col.B, and Col.C. In detail, when three column regions Col.A, Col.B, and Col.C are inspected by the three e-beam irradiators 124A, 124B, and 124C corresponding thereto, a first e-beam irradiator 124A may perform the first scanning S1 from the upper boundary of a first column region Col.A to the boundary between the first column region Col.A and a second column region Col.B, and a second e-beam irradiator 124B may perform the first scanning S1 from the boundary between the first column region Col.A and the second column region Col.B to the boundary between the second column region Col.B and a third column region Col.C. Also, a third e-beam irradiator 124C may perform the first scanning S1 from the boundary between the second column region Col.B and the third column region Col.C to the lower boundary of the third column region Col.C. The boundary between the first column region Col.A and the second column region Col.B may be a first overlapping region Aol1 and may be checked twice by the first e-beam irradiator 124A and the second e-beam irradiator 124B. Also, the boundary between the second column region Col.B and the third column region Col.C may be a second overlapping region Aol2 and may be checked twice by the second e-beam irradiator 124B and the third e-beam irradiator 124C.

Therefore, whether registrations of patterns are being normally inspected may be checked by comparing registrations of patterns obtained by different e-beam irradiators 124 in the first overlapping region Aol1 and the second overlapping region Aol2 to each other. For example, registration of patterns obtained by the first e-beam irradiator 124A for the first overlapping region Aol1 at the end of first scanning S1 may be compared with registrations of patterns obtained by the second e-beam irradiator 124B for the first overlapping region Ao11 at the beginning of the first scanning S1. When the registrations match each other within a permissible range, it may be determined that the registrations of the patterns are inspected normally. When the registrations that match each other exceed the permissible range, it may be determined that there was an anomaly in the inspection of the registrations of the patterns, and thus a cause thereof may be analyzed and eliminated.

FIG. 6B schematically shows a process of calculating the registration of a second pattern Rp2 for the first overlapping region Ao11 through the first e-beam irradiator 124A at the end of the first scanning S1, and FIG. 6C schematically shows a process of calculating the registration of a second pattern Rp2 for the first overlapping region Ao11 through the second e-beam irradiator 124B at the beginning of the first scanning S1. In FIGS. 6B and 6C, second pattern Rpd2 on the design are related to the same second pattern Rp2, and thus the second pattern Rpd2 may be the same. However, a pattern Rpm2 measured by the first e-beam irradiator 124A and a pattern R'pm2 measured by the second e-beam irradiator 124B are measured by different e-beam irradiators 124, and thus the pattern Rpm2 and the pattern R'pm2 may be different from each other. Therefore, a second offset value Δ'A for the second pattern Rp2 by the first e-beam irradiator 124A and a second offset value Δ'B for the second pattern Rp2 by the second e-beam irradiator 124B will differ from each other. Correspondingly, a first offset value ΔA of the first e-beam irradiator 124A and the first offset value ΔB of the second e-beam irradiator 124B may also be different from each other.

Therefore, when a registration $R_A$ of the second pattern Rp2 by the first e-beam irradiator 124A and a registration $R_B$ of the second pattern Rp2 by the second e-beam irradiator 124B are calculated by subtracting first offset values ΔA and ΔB and the positional errors ($e_s$) of the stage 110 from second offset values Δ'A and Δ'B, the registrations $R_A$ and $R_B$ should be the same in case of no abnormality in the inspection. Here, the positional errors ($e_s$) of the stage 110 are the same, and as described above, may be obtained by calculating an average Rav of initial values. In addition, the average δ of registrations of all patterns may converge to zero.

As a result, it may be checked whether an inspection is being normally performed by calculating registrations regarding a same pattern through different e-beam irradiators 124 in an overlapping region and comparing the registrations to each other. Meanwhile, although descriptions are given above with respect to FIGS. 6A to 6C with two overlapping regions Ao11 and Ao12 for three column regions Col.A, Col.B, and Col.C, there may be four or more column regions and three or more overlapping regions depending on the arrangements of the e-beam irradiators 124 in the e-beam array 120. In addition, there may be a plurality of column regions and a plurality of overlapping regions in the direction of the first scanning S1 as well as in the direction of the second scanning S2, and registrations may be calculated through different e-beam irradiators 124 and compared with each other for the patterns in the overlapping regions in the direction of the second scanning S2 to check normality of an inspection.

Figure 7A:
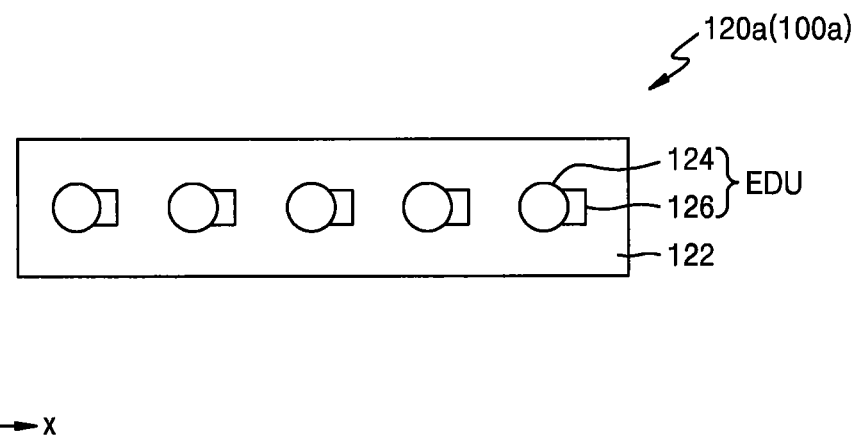
FIGS. 7A and 7B are plan views of e-beam array structures having structures different from that of FIG. 1C in a mask inspection apparatus according to some example embodiments.
Figure 7B:
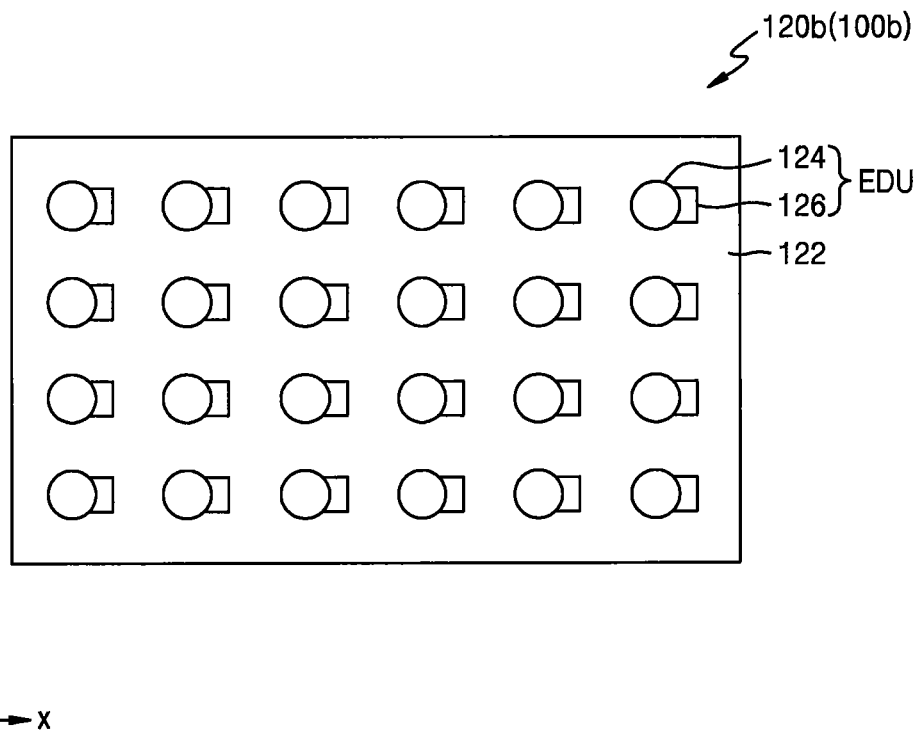

FIGS. 7A and 7B are plan views of e-beam array structures having structures different from that of FIG. 1C in a mask inspection apparatus according to some example embodiments. Descriptions already given above with reference to FIGS. 1A to 6C will be briefly given or omitted.

Referring to FIG. 7A, in some embodiments in a mask inspection apparatus 100a an e-beam array 120a may include a plurality of e-beam irradiators 124 or EDUs arranged in a 1-dimensional array form in the substrate holder 122. Although five e-beam irradiators 124 are arranged in the first direction (x direction), the number of e-beam irradiators 124 is not limited thereto. As such, when the e-beam irradiators 124 are arranged in a 1-dimensional array form and the first direction (x direction) corresponds to the direction of the first scanning S1, a plurality of scannings may be performed in the second direction (y direction) corresponding to the second scanning S2.

Referring to FIG. 7B, in a mask inspection apparatus 100b according to the present embodiment, an e-beam array 120b may include a plurality of e-beam irradiators 124 or EDUs arranged in a 2-dimensional array form in the substrate holder 122. The e-beam irradiators 124 may be arranged in the substrate holder 122 in a 4×6 2-dimensional array form. However, the 2-dimensional array form of the e-beam irradiator 124 is not limited to a 4×6 2-dimensional array form. For example, depending on the shape and size of the mask 200, the 2-dimensional array form of the e-beam irradiator 124 may vary.

Meanwhile, when the e-beam irradiators 124 are arranged in a 4×6 2-dimensional array form, similarly as described above with reference to FIG. 1D, column regions on the mask 200 may be divided by the 4×6 2-dimensional array form, and a column region corresponding to each of the e-beam irradiators 124 may be inspected through a scanning process, thereby inspecting the entire mask 200 more quickly and accurately.

For example, the mask 200 may be inspected more quickly when the e-beam array 120 includes more e-beam irradiators 124 and the e-beam irradiators 124 are arranged in a 2-dimensional array form in the substrate holder 122. However, as the number of e-beam irradiators 124 increases, the cost for fabricating an e-beam array increases, and the number of e-beam irradiators 124 that may be accommodated by the substrate holder 122 may be limited due to the sizes of the e-beam irradiators 124 and the detectors 126. Meanwhile, a size of the substrate holder 122 may be smaller than that of the mask 200 based on the scanning operation.

Figure 8:
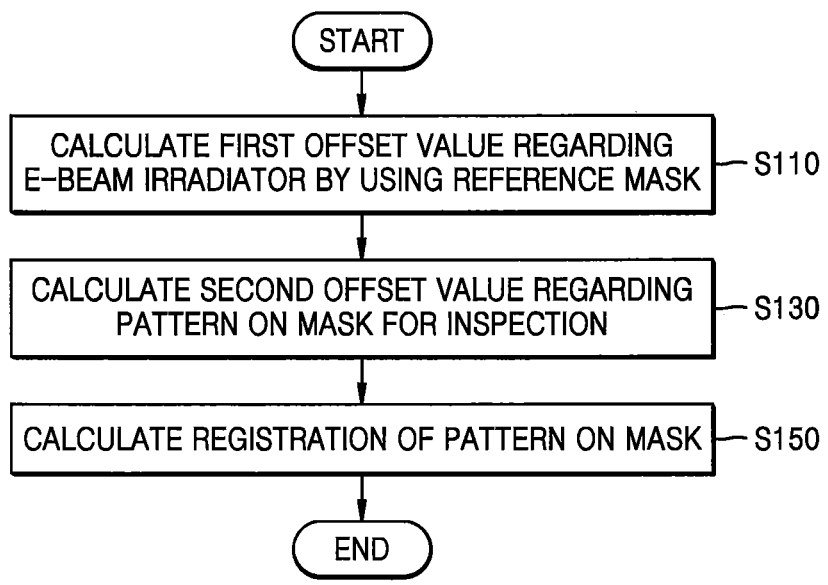
FIG. 8 is a flowchart of a mask inspection method according to some example embodiments.

FIG. 8 is a flowchart of operations of a mask inspection method according to some example embodiments. Descriptions thereof will be given below with reference to FIGS. 1A to 1D together, and descriptions already given above with reference to FIGS. 1A to 7B will be briefly given or omitted.

Referring to FIG. 8, first, a first offset value for the e-beam irradiator 124 in the e-beam array 120 of the mask inspection apparatus 100 may be calculated by using a reference mask (see 200R in FIG. 2A) (operation S110). The first offset value may refer to a degree that the e-beam irradiator 124 is off from its normal position within the substrate holder 122. The calculation of the first offset value will be described below in more detail in the description of FIG. 9A.

Next, a second offset value of a pattern on the mask 200 for inspection may be calculated (operation S130). The second offset value may refer to a degree that a measured position of a pattern on the mask 200 is off from a position thereof on the design. Since the second offset value may be calculated through measurement by the mask inspection apparatus 100, the second offset value may include a positional error due to the e-beam irradiator 124 and a positional error due to the stage 110. The first offset value obtained above may correspond to the positional error due to the e-beam irradiator 124. The calculation of the second offset value will be described below in more detail in the description of FIG. 9B.

Then, registrations of patterns on the mask 200 may be calculated based on the first offset value and the second offset value (operation S150). Since the second offset value includes the positional error due to the e-beam irradiator 124 and the positional error due to the stage 110, the registrations of the patterns on the mask 200 may be calculated by subtracting the positional error due to the e-beam irradiator 124 and the positional error due to the stage 110 from the second offset value. The process of calculating the registrations of the patterns on the mask 200 will be described below in more detail in the description of FIG. 9C.

Figure 9A:
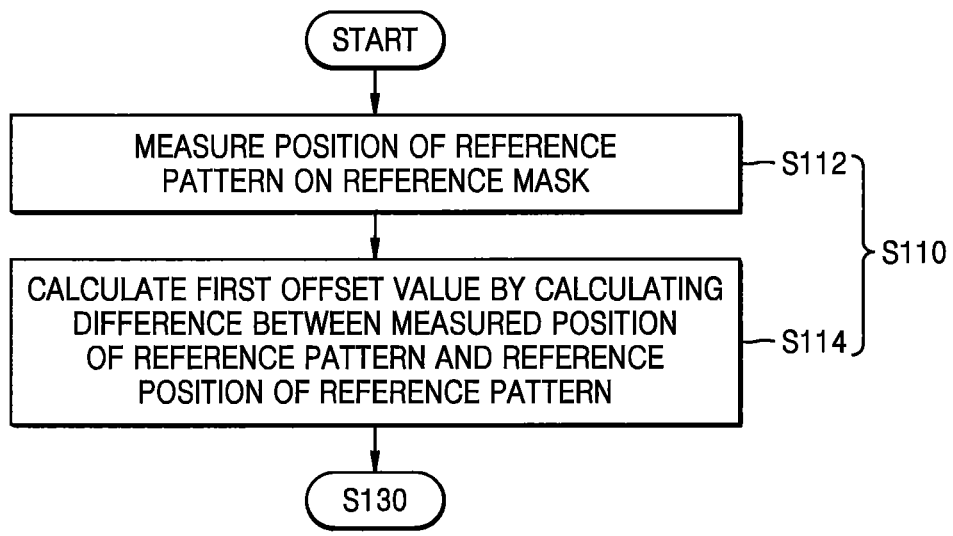
FIGS. 9A to 9C are flowcharts showing operations of the mask inspection method of FIG. 8 in more details.
Figure 9B:
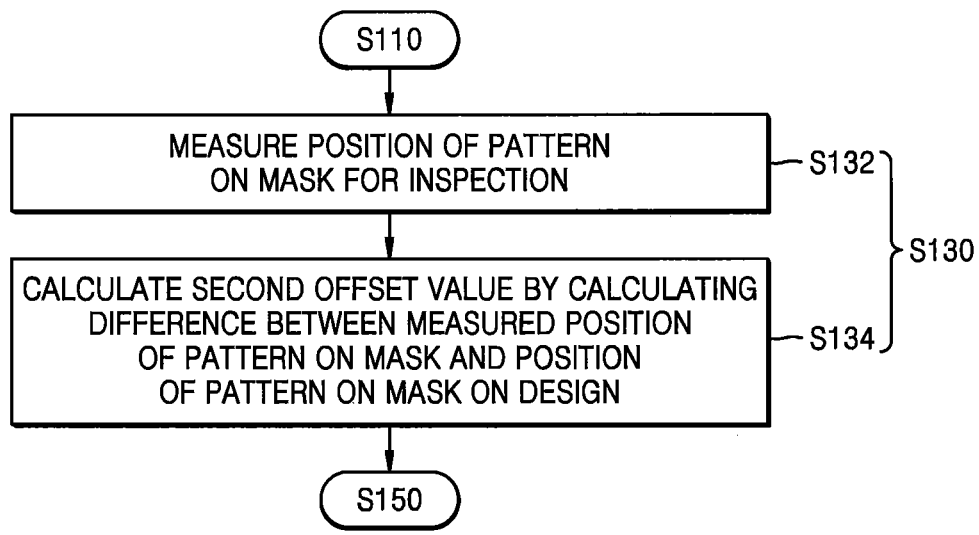
Figure 9C:
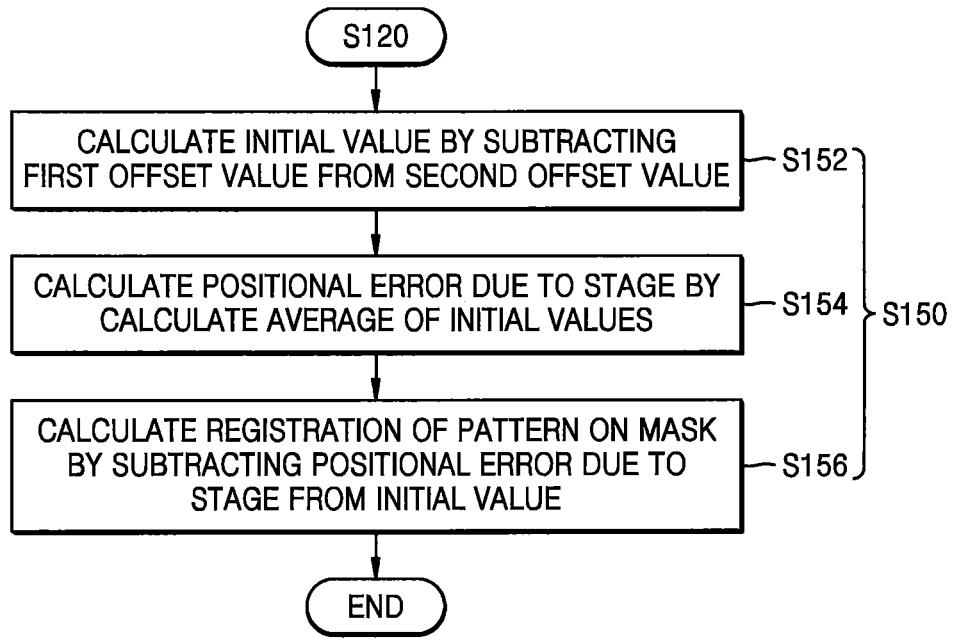

FIGS. 9A to 9C are flowcharts showing operations of the mask inspection method of FIG. 8 in greater detail. Descriptions thereof will be given below with reference to FIGS. 1A to 5B together, and descriptions already given above with reference to FIGS. 1A to 7B will be briefly given or omitted.

Referring to FIG. 9A, the positions of the reference patterns Mr on the reference mask 200R may be measured by using the e-beam array 120 of the mask inspection apparatus 100 (operation S112). The e-beam array 120 includes the e-beam irradiators 124, where each of the e-beam irradiators 124 may measure the position of the reference pattern Mr in a corresponding pattern region.

Next, a difference between the measured position of the reference pattern Mr and the reference position of the reference pattern Mr is calculated and a first offset value is calculated based on the same (operation S114). In other words, the first offset value may be calculated by subtracting the reference position of the reference pattern Mr from the measured position of the reference pattern Mr. Here, the reference position of the reference pattern Mr may correspond to the position of the reference pattern Mr on the design, and the reference position of the reference pattern Mr on the reference mask 200R may be verified. Therefore, by calculating the first offset value, the positional information regarding the e-beam irradiator 124, that is, a degree that the e-beam irradiator 124 is off from a normal position in the substrate holder 122 may be calculated.

Referring to FIG. 9B, first, positions of patterns on the mask 200 for inspection are measured by using the e-beam array 120 of the mask inspection apparatus 100 (operation S132). The e-beam array 120 includes the e-beam irradiators 124, where each of the e-beam irradiators 124 may measure positions of patterns in a corresponding pattern region.

Next, the second offset value is calculated by calculating a difference between the measured position of the patterns on the mask 200 and the positions of the patterns on the mask 200 on the design (operation S134). In other words, the second offset value is calculated by subtracting the position of the patterns on the mask 200 on the design from the measured positions of the patterns on the mask 200. Here, since the measured positions of the patterns on the mask 200 include the positional error due to the e-beam irradiator 124 and the positional error due to the stage 110, the second offset value may also include the positional error due to the e-beam irradiator 124 and the positional error due to the stage 110. Meanwhile, the first offset value may correspond to the positional error due to the e-beam irradiator 124. Therefore, the second offset value may not accurately represent degrees that the positions of the patterns on the mask 200 are off from the positions thereof on the design.

Referring to FIG. 9C, an initial value may be calculated by subtracting a first offset value from a second offset value (operation S152). As described above, since the first offset value may correspond to the positional error due to the e-beam irradiator 124, the initial value may include the registrations of patterns and the positional error due to the stage 110.

Next, the positional error due to the stage 110 may be calculated by calculating an average of initial values (operation S154). The average of the initial values may include an average of the registrations of the patterns and an average of the positional errors due to the stage 110. As described above, the average of the registrations of the patterns may converge to zero. Also, since the positional error due to the stage 110 is the same for all of the e-beam irradiators 124, the average of the positional error of the stage 110 may be substantially the same as the positional error due to the stage 110. Therefore, the positional error due to the stage 110 may be substantially equal to the average of the initial values.

Then, the registrations of the patterns on the mask 200 may be calculated by subtracting the positional error due to the stage 110 from the initial value (operation S156). The positional error due to the stage 110 may be obtained by calculating the average of the initial values as described above. The registrations of the patterns on the mask 200 may be calculated for all of the patterns throughout the mask 200 through a scanning process. Accordingly, the registrations of all of the patterns throughout the mask 200 may be accurately inspected. Also, by using the e-beam array 120 including the e-beam irradiators 124, the registrations of all of the patterns throughout the mask 200 may be quickly inspected.

Figure 10:
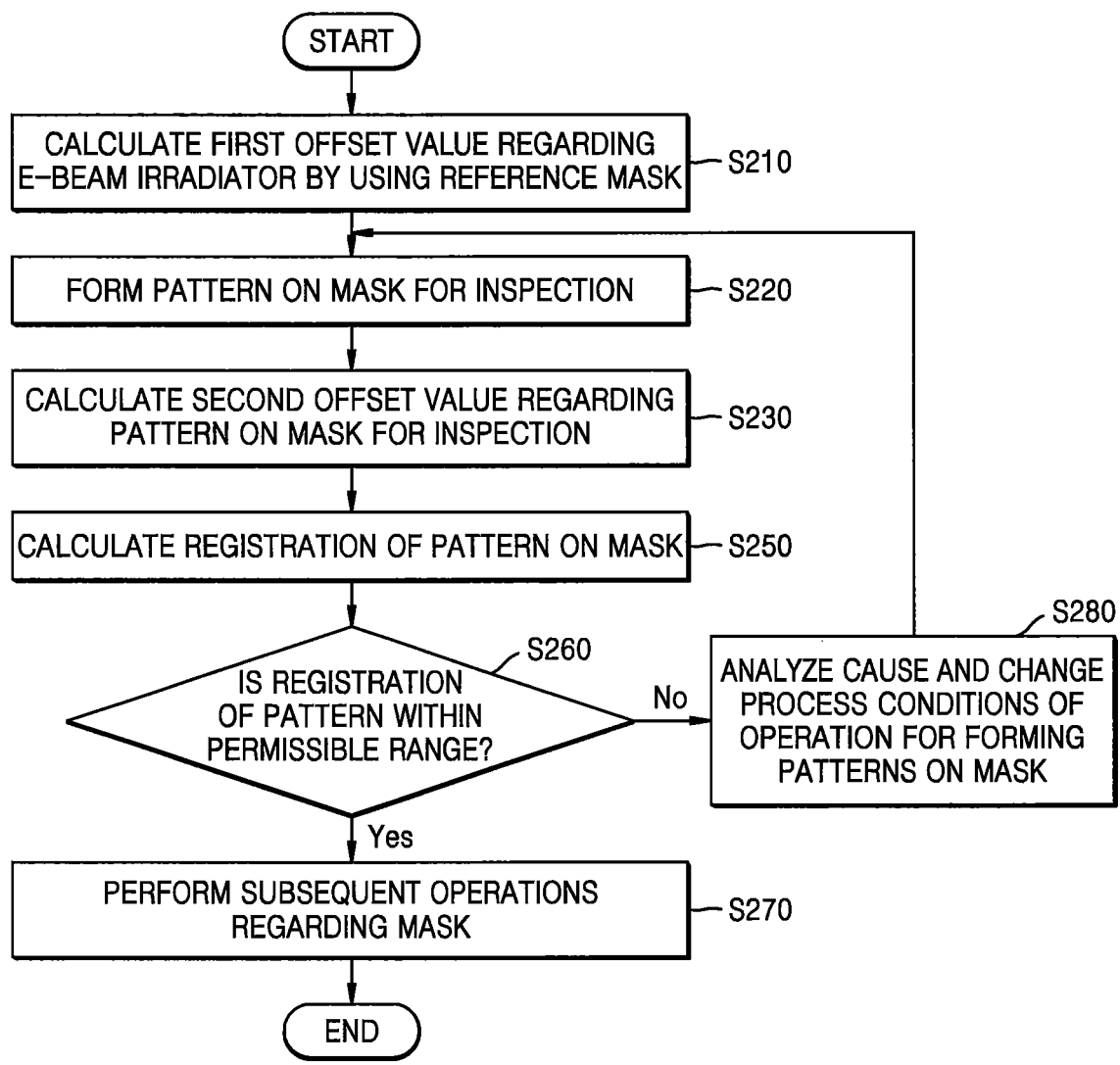
FIG. 10 is a flowchart of a method of manufacturing a mask that includes performing a mask inspection method according to some example embodiments.

FIG. 10 is a flowchart of a method of manufacturing a mask that includes performing a mask inspection method according to some example embodiments. Descriptions thereof will be given below with reference to FIGS. 1A to 1D together, and descriptions already given above with reference to FIGS. 8 to 9C will be briefly given or omitted.

First, referring to FIG. 10, a first offset value for an e-beam irradiator may be calculated by using the reference mask 200R (operation S210). Operation S210 for calculating the first offset value is the same as operation S110 of calculating the first offset value described above with reference to FIGS. 8 and 9A.

Next, patterns may be formed on the mask 200 for inspection (operation S220). Operation S220 for forming the patterns may be performed before operation S210 for calculating the first offset value.

Then, operation S230 for calculating a second offset value and operation S250 for calculating registrations of the patterns may be performed. Operation S230 for calculating the second offset value and operation S250 for calculating the registrations of the patterns are the same as operation S130 for calculating the second offset value described above with reference to FIGS. 8 and 9B and operation S150 for calculating the registrations of the patterns described above with reference to FIGS. 8 and 9C, respectively.

Then, it is determined whether the registrations of the patterns are within a permissible range (operation S260). When the registrations of the patterns are within the permissible range (Yes), subsequent operations regarding the mask 200 may be performed. The subsequent operations regarding the mask 200 may include an operation for applying pellicles to the mask 200, an operation for finally completing the mask 200, etc.

When the registrations of the patterns are not within the permissible range (No), cause(s) thereof may be analyzed and process conditions of the operation for forming patterns on the mask 200 may be changed based on the cause(s) (operation S280). Next, the method may proceed to operation S220 for forming patterns on the mask 200.

While the inventive concepts disclosed herein have been particularly shown and described with reference to embodiments thereof, it will be understood that various changes in form and details may be made therein without departing from the scope of the following claims.

What is claimed is:

1. A mask inspection apparatus comprising:
a stage configured to receive a mask to be inspected;
an e-beam array comprising a plurality of e-beam irradiators configured to irradiate e-beams onto the mask and detectors configured to detect electrons emitted from the mask, wherein the e-beam array comprises n e-beam irradiators, where n is an integer of at least 2; and
a processor configured to process signals from the detectors,
wherein the processor is configured to detect a defect of the mask by processing of the signals, and wherein the processor is configured to inspect registrations of patterns on the mask based on positional information regarding each e-beam irradiator of the plurality of e-beam irradiators, and
wherein a registration based on an i-th (where i is an integer and 1<=i<=n) e-beam irradiator is obtained by subtracting a positional error due to the stage from an initial value obtained by the i-th e-beam irradiator.

2. The mask inspection apparatus of claim 1,
wherein the e-beam irradiators are arranged in a 1-dimensional or 2-dimensional array form on a substrate holder of the e-beam array, and
wherein the positional information is obtained using a reference mask comprising a reference pattern at a reference position.

3. The mask inspection apparatus of claim 2,
wherein a first measured position, which is a position of the reference pattern, is measured by an e-beam irradiator from the plurality of e-beam irradiators, and
wherein the positional information comprises a first offset value that is a difference between the first measured position and the reference position.

4. The mask inspection apparatus of claim 3,
wherein a second measured position, which is a position of the pattern on the mask, is measured by the e-beam irradiator,
a second offset value, which is a difference between the second measured position and the position of the pattern on the mask on a design thereof, is obtained, and
each registration is obtained by subtracting the first offset value from the second offset value.

5. The mask inspection apparatus of claim 1,
wherein registrations are obtained for an entire surface of the mask through a scanning.

6. The mask inspection apparatus of claim 1,
wherein a positional error due to the stage is excluded in the registrations.

7. The mask inspection apparatus of claim 1,
wherein, when the registration based on the i-th e-beam irradiator is denoted by Ri and the positional error due to the stage is denoted by Es, the initial value obtained by the i-th e-beam irradiator is expressed as Ri+Es,
wherein, when an average of initial values by the n e-beam irradiators is denoted by Rav, Rav is expressed by an equation:

$Rav=[R1+R2+,+R(n-1)+Rn]/n+Es$, wherein $[R1+R2+,+R(n-1)+Rn]/n$ converges to zero, and wherein the positional error (Es) due to the stage is obtained as the average (Ray) of initial values.

8. A mask inspection apparatus, comprising:
a stage configured to receive a mask to be inspected;
an e-beam array comprising a plurality of e-beam irradiators configured to irradiate e-beams onto the mask and detectors configured to detect electrons emitted from the mask; and
a processor configured to process signals from the detectors,
wherein the processor is configured to detect a defect of the mask by processing of the signals,
wherein the processor is configured to inspect registrations of patterns on the mask based on positional information regarding each e-beam irradiator of the plurality of e-beam irradiators,
wherein, during a scanning of the mask, there is an overlapping region overlapping between a first region covered by a first e-beam irradiator and a second region covered by a second e-beam irradiator adjacent to the first e-beam irradiator, and
wherein an abnormality of an inspection is checked by using the overlapping region.

9. The mask inspection apparatus of claim 8,
wherein the abnormality of the inspection is checked by comparing a registration obtained in the overlapping region by the first e-beam irradiator at an end of the scanning to a registration obtained in the overlapping region by the second e-beam irradiator at a beginning of the scanning.

10. The mask inspection apparatus of claim 1,
wherein the detectors are disposed in the respective e-beam irradiators.

11. A mask inspection apparatus comprising:
a stage configured to receive a mask for inspection;
a plurality of e-beam irradiation detecting units, each comprising an e-beam irradiator configured to irradiate an e-beam onto the mask and a detector configured to detect electrons emitted from the mask; and
a substrate holder on which the plurality of e-beam irradiation detecting units are arranged in a one-dimensional or two-dimensional array form,
wherein the mask inspection apparatus is configured to detect a defect of the mask via processing a signal from the detector, and wherein the mask inspection apparatus is configured to inspect registrations of patterns on the mask based on positional information of each e-beam irradiation detecting unit of the plurality of e-beam irradiation detecting units,
wherein the positional information comprises a first offset value for each e-beam irradiation detection unit indicating a degree that the respective e-beam irradiator is off from a normal position of the substrate holder, and
wherein each registration is obtained by subtracting the first offset value for each irradiation detection unit from a second offset value for each e-beam irradiation detection unit, wherein each second offset value for each e-beam irradiation detection unit is a difference between a measured position of the pattern on the mask and a position of the pattern on a design thereof.

12. The mask inspection apparatus of claim 11,
wherein the first offset value for each e-beam irradiation detection unit is obtained by measuring a position of a reference pattern on a reference mask with the e-beam irradiation detecting unit and calculating a difference between the measured position of the reference pattern on the reference mask and a reference position of the reference pattern on the reference mask, and wherein the second offset value for each e-beam irradiation detection unit is obtained by measuring a position of the pattern on the mask with the e-beam irradiation detecting unit and calculating a difference between the measured position of the pattern on the mask measured by the e-beam irradiation detecting unit and a position of the pattern on the mask on the design.

13. The mask inspection apparatus of claim 11, wherein, on the substrate holder, at least two e-beam irradiation detecting units are arranged, and wherein the registration is obtained by subtracting a positional error due to the stage from an initial value obtained by each e-beam irradiation detecting unit.

14. The mask inspection apparatus of claim 13, wherein the positional error due to the stage is obtained by averaging initial values obtained by the at least two e-beam irradiation detecting units.

15. The mask inspection apparatus of claim 11, wherein, during a scanning of the mask, there is an overlapping region overlapping between a first region covered by a first e-beam irradiation detecting unit and a second region covered by a second e-beam irradiation detecting unit adjacent to the first e-beam irradiation detecting unit, and wherein an abnormality of the inspection is checked by comparing a registration obtained in the overlapping region by the first e-beam irradiation detecting unit at an end of the scanning to a registration obtained in the overlapping region by the second e-beam irradiation detecting unit at a beginning of the scanning.

* * * * *